United States Patent
Mani

[11] Patent Number: 5,819,205
[45] Date of Patent: Oct. 6, 1998

[54] SIGNAL DELAY COMPUTING METHOD

[75] Inventor: Toshihiro Mani, Tokyo, Japan

[73] Assignee: Mitsubishi Denki Kabushiki Kaisha, Tokyo, Japan

[21] Appl. No.: 769,448

[22] Filed: Dec. 19, 1996

[30] Foreign Application Priority Data

Aug. 7, 1996 [JP] Japan .................................. 8-208417

[51] Int. Cl.$^6$ .................................................. G06F 15/00
[52] U.S. Cl. ........................... 702/79; 364/488; 364/489; 364/490; 327/270; 327/278
[58] Field of Search ..................... 364/577, 578, 364/488, 489, 490, 491; 327/261, 276, 270, 278; 702/79

[56] References Cited

U.S. PATENT DOCUMENTS

| | | | |
|---|---|---|---|
| 4,890,022 | 12/1989 | Endo ........................................ | 327/261 |
| 4,894,791 | 1/1990 | Jiang et al. .............................. | 364/570 |
| 5,180,938 | 1/1993 | Sin ........................................... | 327/288 |
| 5,365,463 | 11/1994 | Donath et al. ........................... | 364/578 |
| 5,416,436 | 5/1995 | Rainard .................................... | 327/270 |
| 5,452,225 | 9/1995 | Hammer ................................... | 364/488 |
| 5,471,409 | 11/1995 | Tani ......................................... | 364/488 |
| 5,515,291 | 5/1996 | Omori et al. ............................ | 364/488 |
| 5,663,889 | 9/1997 | Wakita ..................................... | 364/490 |

*Primary Examiner*—John E. Barlow, Jr.
*Assistant Examiner*—Bryan Bui
*Attorney, Agent, or Firm*—Burns, Doane, Swecker & Mathis, LLP

[57] ABSTRACT

It is an object to provide a signal delay computing method for efficiently improving the accuracy of signal delay values. First, a space (SPi) including a load capacitance value (C1), a load resistance value (R1) and a transition delay value (D0) is selected. Next, eight vertexes (u1 to u8) of the space (SPi) are extracted. The vertex uk (k=1 to 8) is represented by coordinates as ($C1_{uk}$, $R1_{uk}$, $D0_{uk}$, $D1_{uk}$). The combination of these values about one vertex are known by circuit simulation. Next, substitution of the values of the coordinates into a delay computing equation is performed in order for all of the integers k=1 to 8. Then eight simultaneous equations are obtained. The simultaneous equations are solved to determine the values of the coefficients ($W_{0i}$ to $W_{7i}$) in the delay computing equation. The coefficients ($W_{0i}$ to $W_{7i}$) determined, the load capacitance value (C1), the load resistance value (R1) and the transition delay value (D0) are substituted into the delay computing equation to determine an objective transition delay value (D1).

22 Claims, 22 Drawing Sheets

F I G. 1
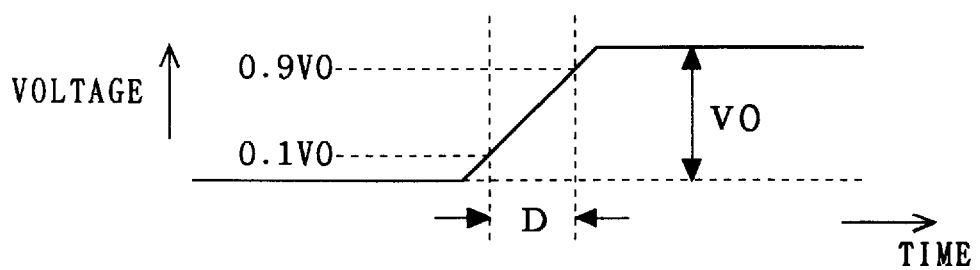
F I G. 2
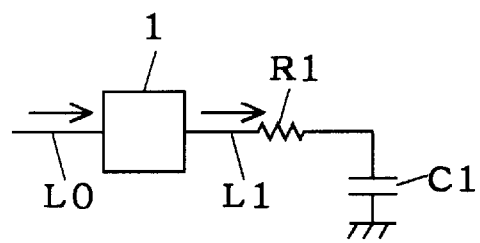

FIG. 5
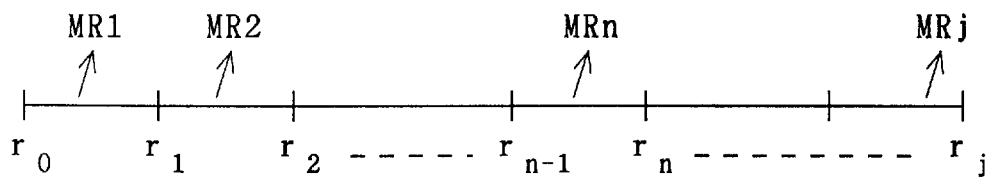
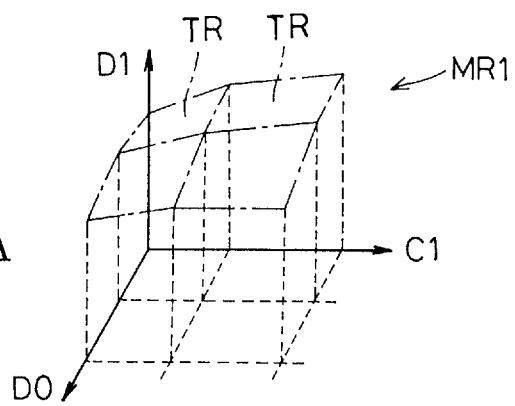
FIG. 6A
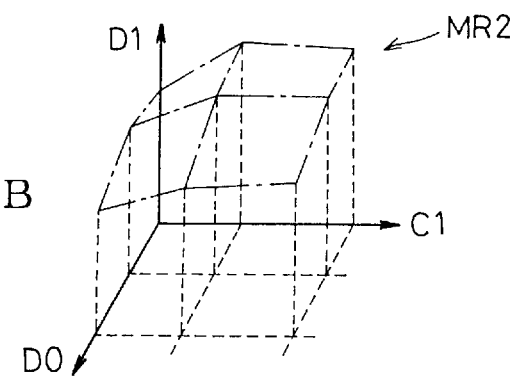
FIG. 6B
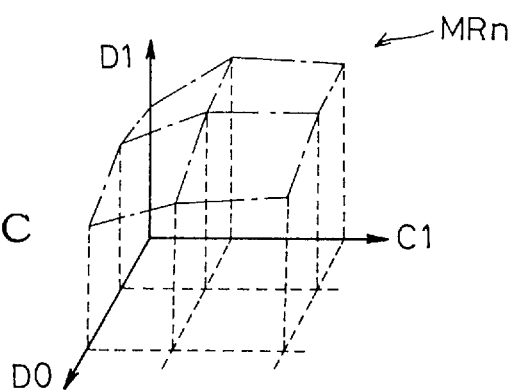
FIG. 6C

FIG. 8
$p1 = \quad (C1_{p1}, \ DO_{p1}, \ D1_{p1})$
$p2 = \quad (C1_{p2}, \ DO_{p2}, \ D1_{p2})$
$p3 = \quad (C1_{p3}, \ DO_{p3}, \ D1_{p3})$
$p4 = \quad (C1_{p4}, \ DO_{p4}, \ D1_{p4})$
FIG. 9
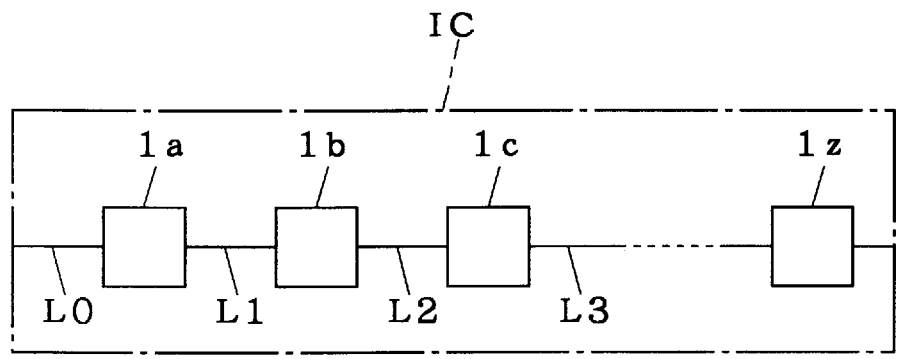
FIG. 10
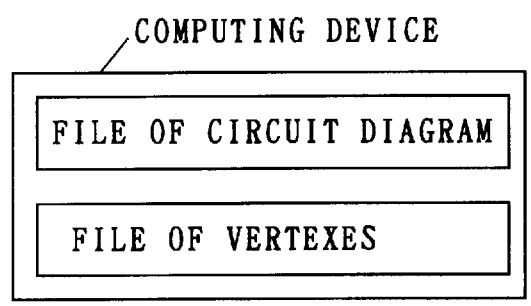

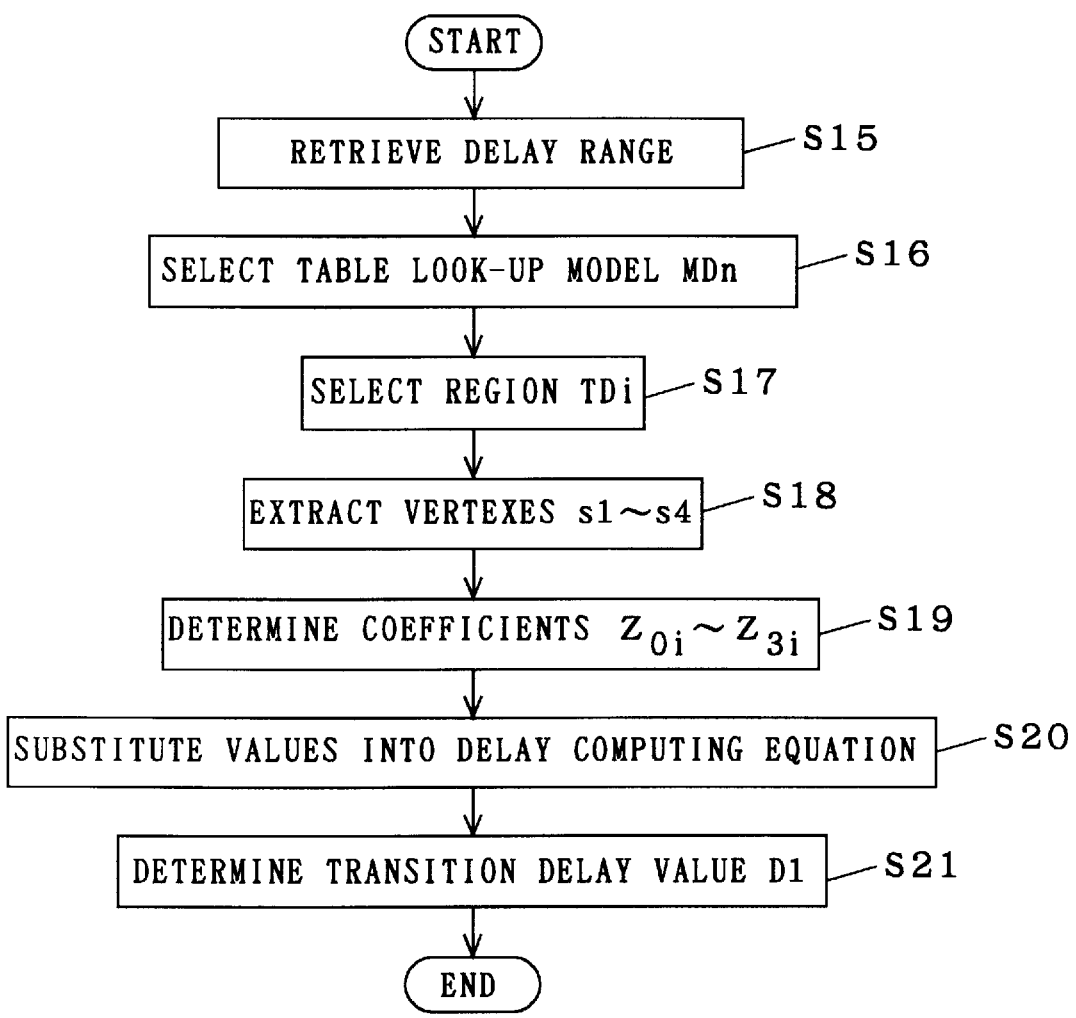

$s1 = \quad (R1_{s1}, \quad C1_{s1}, \quad D1_{s1})$
$s2 = \quad (R1_{s2}, \quad C1_{s2}, \quad D1_{s2})$
$s3 = \quad (R1_{s3}, \quad C1_{s3}, \quad D1_{s3})$
$s4 = \quad (R1_{s4}, \quad C1_{s4}, \quad D1_{s4})$ SPi $u1 = (C1_{u1}, R1_{u1}, D0_{u1}, D1_{u1})$ $u2 = (C1_{u2}, R1_{u2}, D0_{u2}, D1_{u2})$ $u3 = (C1_{u3}, R1_{u3}, D0_{u3}, D1_{u3})$ $u4 = (C1_{u4}, R1_{u4}, D0_{u4}, D1_{u4})$ $u5 = (C1_{u5}, R1_{u5}, D0_{u5}, D1_{u5})$ $u6 = (C1_{u6}, R1_{u6}, D0_{u6}, D1_{u6})$ $u7 = (C1_{u7}, R1_{u7}, D0_{u7}, D1_{u7})$ $u8 = (C1_{u8}, R1_{u8}, D0_{u8}, D1_{u8})$ $p1 = (C1_{p1}, D0_{p1}, D1_{p1})$
$p2 = (C1_{p2}, D0_{p2}, D1_{p2})$
$p3 = (C1_{p3}, D0_{p3}, D1_{p3})$
$p4 = (C1_{p4}, D0_{p4}, D1_{p4})$

SIGNAL DELAY COMPUTING METHOD

BACKGROUND OF THE INVENTION

1. Field of the Invention

The present invention relates to a signal delay computing method for computing delay values of signals, created in lines in semiconductor integrated circuits.

2. Description of the Background Art

First, a signal transition delay value computing method according to the conventional art will be described. FIG. 37 is a schematic diagram showing a table look-up model used in the transition delay value computing method according to the conventional art. The transition delay value D0 and the load capacitance value C1 shown in the figure represent a delay value of a signal, created in a line on the input side connected to an input terminal of a macro cell and a load capacitance value in a line on the output side connected to an output terminal of the macro cell. The transition delay value D1 indicates a delay value of the signal in the line on the output side.

That is to say, this table look-up model shows the relation between the transition delay value D0 and the load capacitance value C1, and the transition delay value D1. The transition delay value D1 is expressed by the curved plane formed of the solid lines in the figure and a function for approximation thereof (hereinafter referred to as a delay computing equation) is expressed by the curved plane formed of the one-dot chain lines.

The transition delay value computing method according to the conventional art will now be described. FIG. 38 is a flow chart showing the procedure of the conventional transition delay value computing method. First, a region Ti on the table look-up model which corresponds to the transition delay value D0 and the load capacitance value C1 is selected, as shown in FIG. 39. Next, four vertexes p1 to p4 corresponding to the region Ti are extracted. The values of the coordinates of the vertexes p1 to p4 include, as shown in FIG. 40, the load capacitance values $C1_{p1}$ to $C1_{p4}$, the transition delay values in the line on the input side, $D0_{p1}$ to $D0_{p4}$, and the transition delay values on the output side which have been already obtained in correspondence with those values, $D1_{p1}$ to $D1_{p4}$.

Next, computing using the values of the coordinates of the vertexes p1 to p4 provides a delay computing equation about the transition delay value D1 with its coefficients determined. The transition delay value D0 and the load capacitance value C1 are substituted into this delay computing equation to obtain a corresponding transition delay value D1.

In the conventional transition delay value computing method, the transition delay value D1 on the output side of a macro cell is computed using the transition delay value D0 of signal transmitted from the input terminal side and the load capacitance value C1 at the output terminal as parameters. This transition delay value computing method, however, does not consider the load resistance value of the line on the output terminal side as a parameter. This introduces the problem that the accuracy of the transition delay value D1 is low.

Usual circuit simulation is also used to obtain the transition delay value D1, the cell delay value and the path delay value, using the load resistance value of the line on the output terminal side. This improves the accuracy, but requires too much time to accomplish computation for a large-scale semiconductor integrated circuit.

SUMMARY OF THE INVENTION

A first aspect of the present invention is directed to a signal delay computing method preparing a relation obtained between a first group which is a set of discrete particular values of a signal delay value in a first line and second and third groups which are, respectively, sets of discrete particular values of a load resistance value and a load capacitance value in a second line connected to an output side of a circuit element having its input side connected to the first line; and a signal delay value in the second line, and determining wherein the signal delay value in the second line corresponding to the signal delay value in the first line, the load resistance value and the load capacitance value on the basis of the relation.

Preferably, according to a second aspect of the present invention, in the determination, at least two of the signal delay value in the first line, the load resistance value and the load capacitance value are selected as parameters for interpolation, and among the discrete particular values included in ones of the first through third groups which correspond to the parameters, two which are the closest to each of the parameters are selected as extracted values for each of the parameters, and the interpolation is performed using the extracted values.

Preferably, according to a third aspect of the present invention, in the signal delay computing method, the signal delay value in the first line, the load resistance value and the load capacitance value are selected as the parameters.

Preferably, according to a fourth aspect of the present invention, in the signal delay computing method, coefficients corresponding to the parameters in an approximation equation used in the interpolation are prepared for a combination of the discrete particular values of the first through third groups, and approximation value of the signal delay value in the second line is obtained according to the signal delay value in the first line, and the load resistance value and the load capacitance value.

According to the structure of the first aspect, a signal delay value on the second line is determined considering the load resistance value. This improves the accuracy of the signal delay value on the second line. Also, using the signal delay value on the second line when obtaining a cell delay value used to compute a path delay value improves the accuracy of the path delay value. Operation verification of a large-scale circuit can thus be accurately accomplished.

According to the structure of the second aspect, the structure of the first aspect can be easily realized by using a known method, interpolating.

According to the structure of the third aspect, since the signal delay value on the first line, the load resistance value and the load capacitance value on the second line are all utilized as parameters in the interpolating, they are directly reflected in the signal delay value on the second line. This further improves the accuracy of the signal delay value on the second line, in addition to the effect of the structure of the second aspect.

According to the structure of the fourth aspect, an approximation equation is quickly obtained and therefore the speed of computing the signal delay value on the second line is increased. This enables computation of signal delays in a large-scale circuit composed of a large number of circuit elements.

It is an object of the present invention to provide a signal delay computing method which considers not only a signal delay value in a first line and a load capacitance value in a second line but also a load resistance value on the second line to determine a signal delay value on the second line so as to efficiently improve the accuracy of the signal delay value.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a waveform diagram showing an example of definition of the transition delay value D.

FIG. 2 is a circuit diagram showing an example of structure of a circuit which is subjected to the transition delay value computing method of a first preferred embodiment.

FIG. 5 is a schematic diagram showing a first example of the structure of the transition delay value computing method of the first preferred embodiment.

FIG. 6A to 6C are schematic diagrams showing examples of the structure of the table look-up models MR1, MR2, MRn of the first preferred embodiment.

FIG. 8 is a schematic diagram illustrating coordinates of the vertexes p1 to p4 of the region TRi shown in FIG. 7.

FIG. 9 is a schematic diagram showing an example of the structure of the circuit.

FIG. 10 is a schematic diagram showing an example of the structure of the computing device.

FIG. 19 is a schematic diagram illustrating coordinates of the vertexes q1 to q4 of the region TCi shown in FIG. 18.

FIG. 20 is a flow chart showing a third example of the procedure of the transition delay value computing method of the first preferred embodiment.

DESCRIPTION OF THE PREFERRED EMBODIMENTS

First Preferred Embodiment

Figure 3:
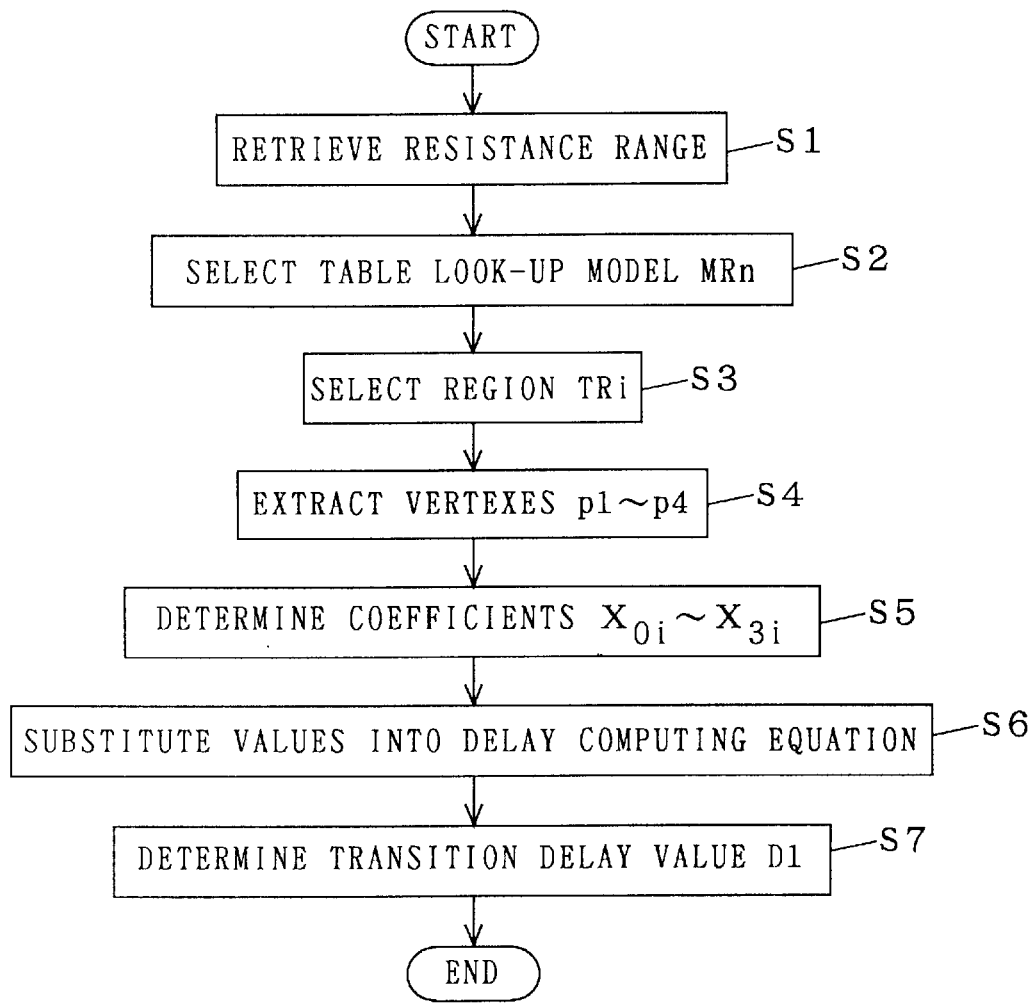
FIG. 3 is a flow chart showing a first example of the procedure of the transition delay value computing method of the first preferred embodiment.

In this preferred embodiment, the same components and structures as the conventional art are shown at the same reference characters. This preferred embodiment discloses a method in which one of the transition delay value D0, the load resistance value R1 and the load capacitance value C1 is used to select a table look-up model and the remaining two are used in a delay computing equation to determine the transition delay value D1.

First, the definition of the transition delay value will be described. FIG. 1 is a waveform diagram showing an example of definition of the transition delay value D. This diagram shows the case in which the signal changes from Low to High. The transition delay value D is defined as a time that the voltage V takes to change from 0.1 to 0.9 time (from 10% to 90%) of V0 when changing from 0 to the voltage V0. It goes without saying, however, that the transition delay value D can be defined by other numerals.

FIG. 2 is a schematic diagram illustrating the structure of a circuit which is subjected to the transition delay value computing method. The lines L0 and L1 are connected to the input terminal and the output terminal of the macro cell 1. A signal is inputted to the macro cell 1 through the line LO in the direction shown by the arrow in the figure, and outputted from the macro cell 1 through the line L1. On the line L1, its load resistance R1 and load capacitance C1 are schematically shown. The reference characters "R1" and "C1" are used in common to represent the load resistance and its value and the load capacitance and its value, respectively. The transition delay values D of the signal on the lines L0 and L1 correspond to the transition delay values D0 and D1, respectively.

FIG. 3 is a flow chart illustrating the procedure of the transition delay value computing method according to this preferred embodiment. The transition delay value D1 is computed according to the procedure shown in this diagram. In the transition delay value computing method illustrated in this diagram, the load resistance value R1 is used as the basis of the range selection, based on which a table look-up model MRn is selected.

Figure 4:
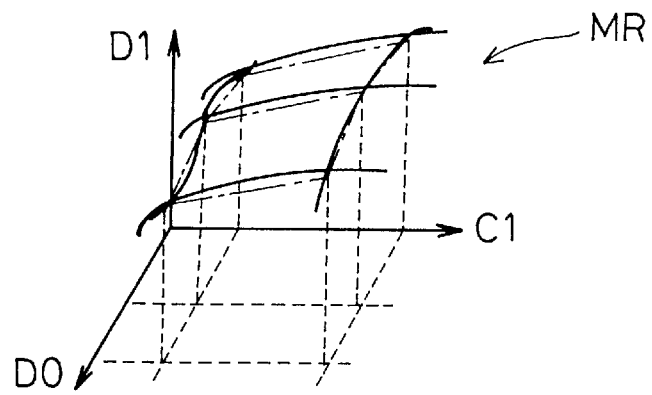
FIG. 4 is a schematic diagram showing an example of the structure of the table look-up model MR of the first preferred embodiment.

The table look-up models used in the transition delay value computing method will now be described. FIG. 4 is a schematic diagram illustrating a table look-up model MR. As shown in the figure, the table look-up model MR is a model including as its components (parameters) the transition delay value D0 and the load capacitance value C1, and the corresponding transition delay value D1. The table look-up model MR corresponds to a certain resistance range. The resistance range will be described later.

In FIG. 4, the plane representing the transition delay value D1 is formed of the plurality of solid lines. The plane representing a delay computing equation for approximating the transition delay value D1 is expressed by the one-dot chain lines. The delay computing equation is given as:

$$D1 = X_{0i} + X_{1i} \times C1 + X_{2i} \times D0 + X_{3i} \times C1 \times D0 \quad (1)$$

The transition delay value D1 is approximately obtained by using the delay computing equation existing in the table look-up model MR.

FIG. 5 is a schematic diagram showing the correspondence between the load resistance value R1 and the table look-up model MR. The load resistance value R1 is divided into j resistance ranges by the dividing points $r_0, r_1, \ldots, r_j$. A table look-up model MRn corresponds in a one-to-one correspondence to a resistance range interposed between adjacent dividing points $r_{n-1}$ and $r_n$. Here, $i \leq n \leq j$. The table look-up model MR is used to generically refer to the table look-up models MR1 to MRj.

FIG. 6A to 6C are schematic diagrams respectively illustrating the table look-up models MR1, MR2, and MRn. As depicted in these diagrams, the table look-up model MR differs for each resistance range. In the table look-up model MR, the axes representing the transition delay value D0 and the load capacitance value C1 are divided as shown by the broken lines. That is to say, the axes of the transition delay value D0 and the load capacitance value C1 are divided into a plurality of delay ranges and capacitance ranges. Corresponding to the combinations of the ranges, the plane of the transition delay value D0—the load capacitance value C1 is partitioned into a plurality of regions.

The procedure of the transition delay value computing method of this preferred embodiment will now be described in detail. A computing device which carries out the transition delay value computing method first retrieves a resistance range which includes the load resistance value R1 on the line L1 from among the resistance ranges shown in FIG. 5 (Step S1 shown in FIG. 3.) Next, it selects a table look-up model MRn corresponding to this resistance range (Step S2).

Figure 7:
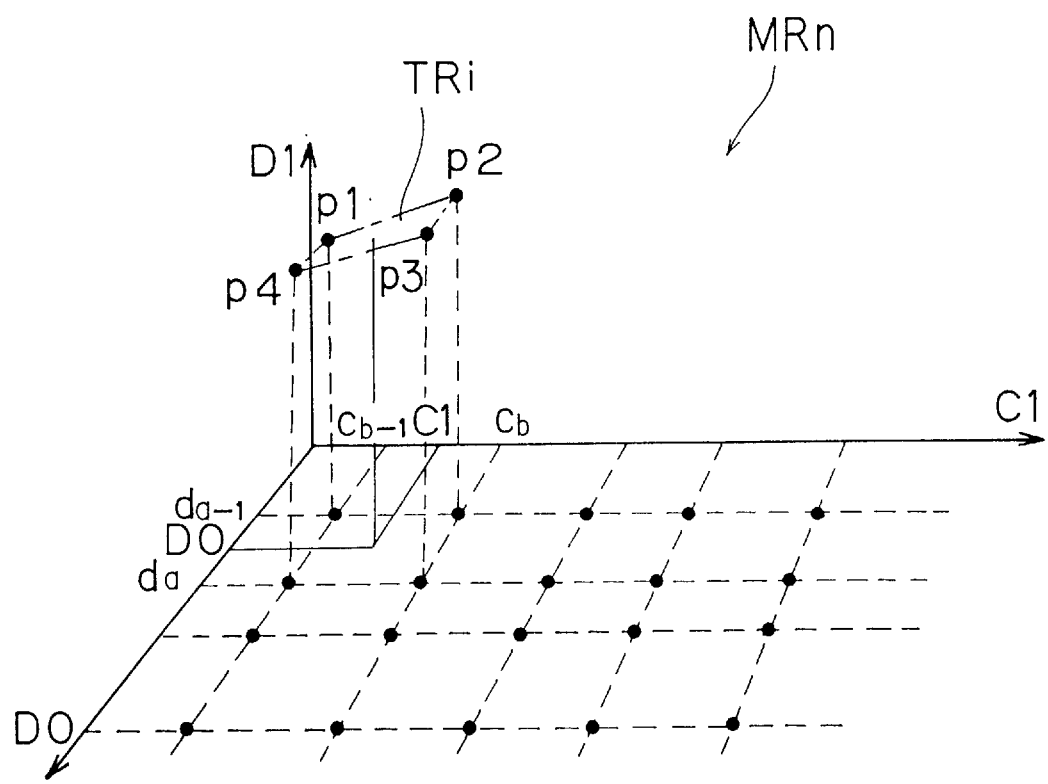
FIG. 7 is a schematic diagram showing the first example of the structure of the transition delay value computing method of the first preferred embodiment.

Next, it retrieves from among the regions shown in FIG. 7 (the plurality of regions divided by the broken lines on the plane of transition delay value D0—load capacitance value C1) one including the load capacitance value C1 and the transition delay value D0. The region is retrieved as follows.

As to the transition delay value D0, from among the values of the transition delay values at the intersections of the axis of the transition delay value D0 and the broken lines perpendicular to it, two which are the closest to the objective transition delay value D0 are selected. (In FIG. 7, they correspond to "$d_{a-1}$", "$d_a$".) As to the load capacitance value C1, in the same way, from among the values of the load capacitance values at the intersections of the axis of the load capacitance value C1 and the broken lines perpendicular to it, two which are the closest to the objective load capacitance value C1 are selected. (In FIG. 7, they correspond to "$c_{b-1}$", "$c_b$".) These data are stored in a file. The region surrounded by the four points each represented by a combination of any of the coordinates $d_{a-1}$, $d_a$ and any of the coordinates $c_{b-1}$, $c_b$ corresponds to the region retrieved.

Next, a region TRi corresponding to the region retrieved is selected in the table look-up model MRn (Step S3). The region TRi is one of the plurality of divided regions on the plane representing the delay computing equation for the transition delay value D1. The character "i" in "TRi" stands for numbers of the plurality of regions "TR" (shown in FIG. 6A).

Next, the four vertexes p1 to p4 of the region TRi are extracted (Step S4). The computing device stores the vertexes p1 to p4 for each region TR in a file. The extraction is accomplished by calling the vertexes p1 to p4 in the file in correspondence with the region TRi.

FIG. 8 is a schematic diagram showing the coordinates of the vertexes p1 to p4. As shown in this figure, the vertex pk is represented by the coordinates ($C1_{pk}$, $D0_{pk}$, $D1_{pk}$). Here, k represents an arbitrary integer among 1 to 4.

As shown in FIG. 8, the vertex pk has, as its coordinate components, the coordinates $C1_{pk}$, $D0_{pk}$, which are one of the load capacitance values C1 and one of the transition delay values D0, and the coordinate $D1_{pk}$, which is one of the transition delay values D1 which are known for the combinations of the values $C1_{pk}$, $D0_{pk}$.

Next, substitution of the three coordinates $C1_{pk}$, $D0_{pk}$, $D1_{pk}$ of the vertex pk into the C1, D0, D1 in the equation (1) is repeated in order for k=1 to 4. This provides:

$$D1_{p1} = X_{0i} + X_{1i} \times C1_{p1} + X_{2i} \times D0_{p1} + X_{3i} \times C1_{p1} \times D0_{p1} \quad (2)$$

$$D1_{p2} = X_{0i} + X_{1i} \times C1_{p2} + X_{2i} \times D0_{p2} + X_{3i} \times C1_{p2} \times D0_{p2} \quad (3)$$

$$D1_{p3} = X_{0i} + X_{1i} \times C1_{p3} + X_{2i} \times D0_{p3} + X_{3i} \times C1_{p3} \times D0_{p3} \quad (4)$$

$$D1_{p4} = X_{0i} + X_{1i} \times C1_{p4} + X_{2i} \times D0_{p4} + X_{3i} \times C1_{p4} \times D0_{p4} \quad (5)$$

The coordinates surrounded by the two-dot chain line in FIG. 8 are necessary to determine the region TRi. The coordinates $C1_{p1}$, $C1_{p4}$ correspond to the coordinate $c_{b-1}$, shown in FIG. 7. Similarly, the coordinates $C1_{p2}$, $C1_{p3}$ correspond to the coordinate $c_b$. The coordinates $D0_{p1}$, $D0_{p2}$ correspond to the coordinate $d_{a-1}$ and the coordinates $D0_{p3}$, $D0_{p4}$ correspond to the coordinate $d_a$. The coordinates surrounded by the solid line are necessary to determine the coefficients $X_{0i}$ to $X_{3i}$ included in the delay computing equation.

By solving the simultaneous equations (2) to (5), the values of the coefficients $X_{0i}$ to $X_{3i}$ in the delay computing equation are determined (Step S5). Next, the coefficients $X_{0i}$ to $X_{3i}$ determined, the load capacitance value C1 and the transition delay value D0 are substituted into the equation (1) (Step S6). Then the objective transition delay value D1 is determined (Step S7).

FIG. 9 is a schematic diagram showing the structure of a semiconductor integrated circuit IC having macro cells 1a to 1z connected in order from the input pin to the output pin. The computing device which carries out the transition delay value computing method computes the transition delay values D in order from the input pin to the output pin of the semiconductor integrated circuit IC. In more detail, this computing device sequentially obtains transition delay values D on the lines starting from the line on the input pin side. It obtains the transition delay value D on the next line by using the previous one. FIG. 10 is a schematic diagram illustrating the structure of the computing device. The computing device has a file in which a semiconductor integrated circuit diagram is described and a file in which the vertexes p1 to p4 of each region TRi are described for each macro cell.

A user can set a transition delay value D on the line LO connected to the input pin in advance. When the user does not set the transition delay value D, the computing device uses zero as the transition delay value D and sequentially computes the transition delay values D on the lines in the semiconductor integrated circuit IC.

Using the transition delay value on the line on the input side of the macro cell, or two transition delay values on the lines on the input side and the output side of the macro cell, the computing device computes a cell delay value of that macro cell. The cell delay value is a delay value of signal from the input terminal of the macro cell to its output terminal. On the basis of the cell delay values, a path delay value in the semiconductor integrated circuit IC is also computed.

In this preferred embodiment, the transition delay value is computed by using the transition delay value on the line in the previous stage. Then an increase in accuracy of a transition delay value on one line results in an increase in accuracy of all transition delay values. Furthermore, since the transition delay values are used to compute the cell delay value, the increase in accuracy of the transition delay values is also reflected in an increase in accuracy of the cell delay values. Accordingly, determining the transition delay values while considering the load resistance value R1 as well is extremely effective in obtaining delays of signal in a semiconductor integrated circuit.

This invention adopts the method of computing the transition delay values using the delay computing equation instead of the circuit simulation method. Hence, the computation requires a shorter time than that using the circuit simulation. Thus the method of this preferred embodiment is extremely helpful and efficient also when obtaining signal delays in a large-scale semiconductor integrated circuit.

Figure 11:
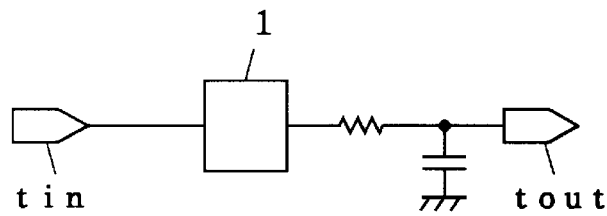
FIG. 11 is a schematic diagram showing an example of the structure of a circuit model for producing the table look-up models of the first preferred embodiment.

Now, the method of producing the table look-up model MR will be described. FIG. 11 is a schematic diagram illustrating the structure of a circuit model used in circuit simulation for producing the table look-up model MR. In this figure, the input terminal tin, the input-side line, the macro cell 1, the resistance, the output-side line and the output terminal tout are sequentially connected in series. A capacitance is provided between the output-side line and the output terminal tout.

The values of the resistance and the capacitance, which are used to realize the load resistance R1 and the load capacitance C1 of FIG. 2, are set to discrete "particular values" to carry out simulation of the load resistance value R1 and the load capacitance value C1. The "particular value" will now be described about the resistance as an example. The resistance is recognized in the units of resistance ranges to select the table look-up model MRn from the table look-up models MR, as explained above. Accordingly, one typical value (hereinafter referred to as a "typical load resistance value r") in each resistance range shown in FIG. 5 is adopted as the "particular value" of the resistance. As the typical load resistance value r, for example, the coordinate of the middle point between the adjacent dividing points $r_{n-1}$ and dividing point $r_n$ shown in FIG. 5, $(r_{n-1}+r_n)/2$, can be adopted. The method of producing the table look-up model MR will be described below.

(1) One typical load resistance value r included in one resistance range is set.

(2) A discrete particular value (a typical transition delay value) d0 is set for the transition delay value D0. Similarly, a discrete particular value (a typical load capacitance value) c is set for the load capacitance value C1. They are set to determine a region on the plane representing the delay computing equation in the table look-up model MR. That is to say, the combinations of the typical transition delay value d0 and the typical load capacitance value c correspond to the black points on the plane representing transition delay value D0—load capacitance value C1 shown in FIG. 7.

Figure 12:
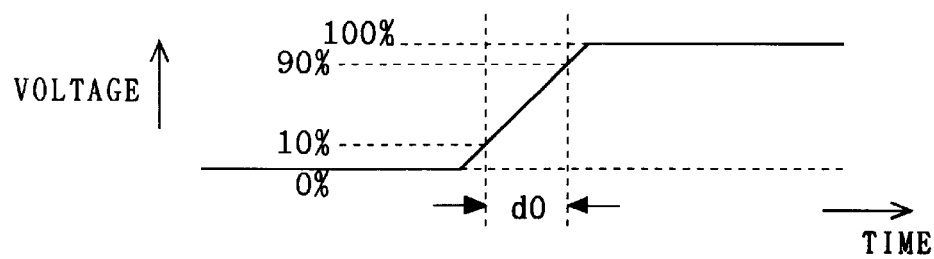
FIG. 12 is a waveform diagram showing an example of a signal inputted to the circuit model shown in FIG. 11.

(3) A circuit model is produced which is characterized by the typical load resistance value r and the typical load capacitance value c. FIG. 12 is a waveform diagram illustrating the waveform of a signal inputted to the input terminal tin. This signal is characterized by the typical transition delay value d0 and is inputted from the input terminal tin of the circuit model. The circuit simulation is conducted by inputting the signal shown in FIG. 12 to the circuit model. The result obtained by the circuit simulation corresponds to one transition delay value D1 which corresponds to the typical transition delay value d0, the typical load resistance value r and the typical load capacitance value c. The results thus obtained are used as the values of coordinates of the vertexes p1 to p4 of such a region TRi as shown in FIG. 7.

(4) The processes of (2) and (3) are performed for all combinations composed of the typical transition delay values d0 and the typical load capacitance values c.

(5) The processes of (1) to (4) are performed for all typical load resistance values r.

By the procedure described above, the table look-up model MR is produced for each resistance range as shown in FIG. 5. This is the method of producing the table look-up models.

It is possible to use the transition delay value computing method of this preferred embodiment in the static timing analysis and the dynamic timing analysis. That is to say, when performing the static timing analysis or the dynamic timing analysis, the transition delay values D1 are computed on the basis of the transition delay value computing method of this preferred embodiment. This also improves the accuracy of the cell delay values and the path delay values, similarly to the aforementioned effects.

Figure 13:
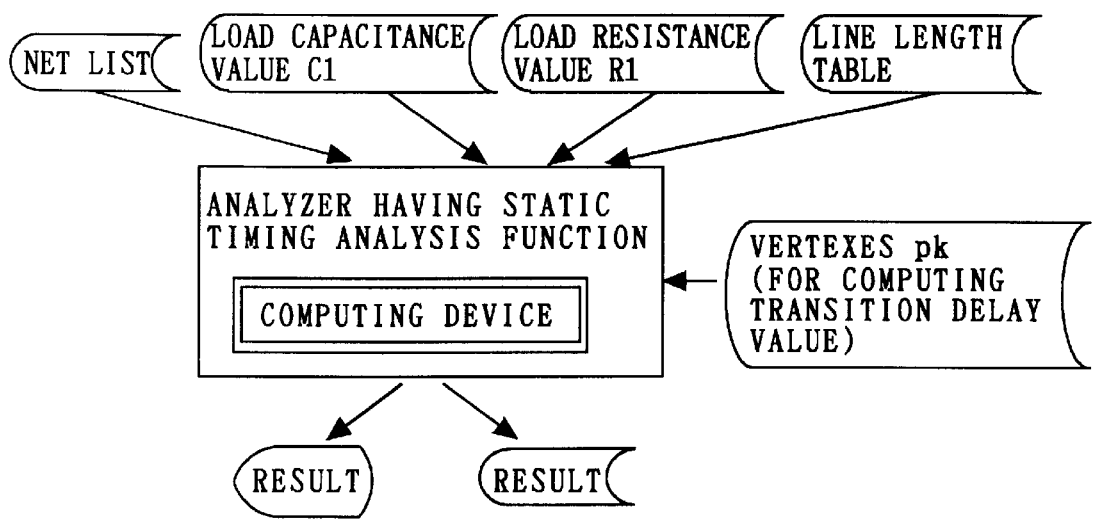
FIG. 13 is a schematic diagram showing an example of the structure of the static timing analysis.

FIG. 13 is a schematic diagram illustrating the structure of an analysis device having a static timing analyzing function and input/output files related to it. The results of the timing analysis are obtained by using the files storing data about net list, load capacitance values C1, load resistance values R1, line length table and vertexes pk and the analyzing device having the static timing analyzing function. The same can be applied to the dynamic timing analysis.

In the description provided above, a table look-up model MR is selected according to the load resistance value R1 and a corresponding transition delay value D1 is obtained by using the transition delay value D0 and the load capacitance value C1 as components in this table look-up model MR. (This is referred to as a first case hereinafter.) However, the present invention is not limited to the first case.

It is also possible to select the table look-up model according to the load capacitance value C1 and obtain the transition delay value D1 according to the transition delay value D0 and the load resistance value R1. This is referred to as a second case. It is also possible to select the table look-up model according to the transition delay value D0 and obtain the transition delay value D1 corresponding to the load capacitance value C1 and the load resistance value R1. This is referred to as a third case. In these cases, the transition delay value D1 can be obtained by procedures similar to that described above. First, it will be described taking the difference between the first case and the second case into account.

Figure 14:
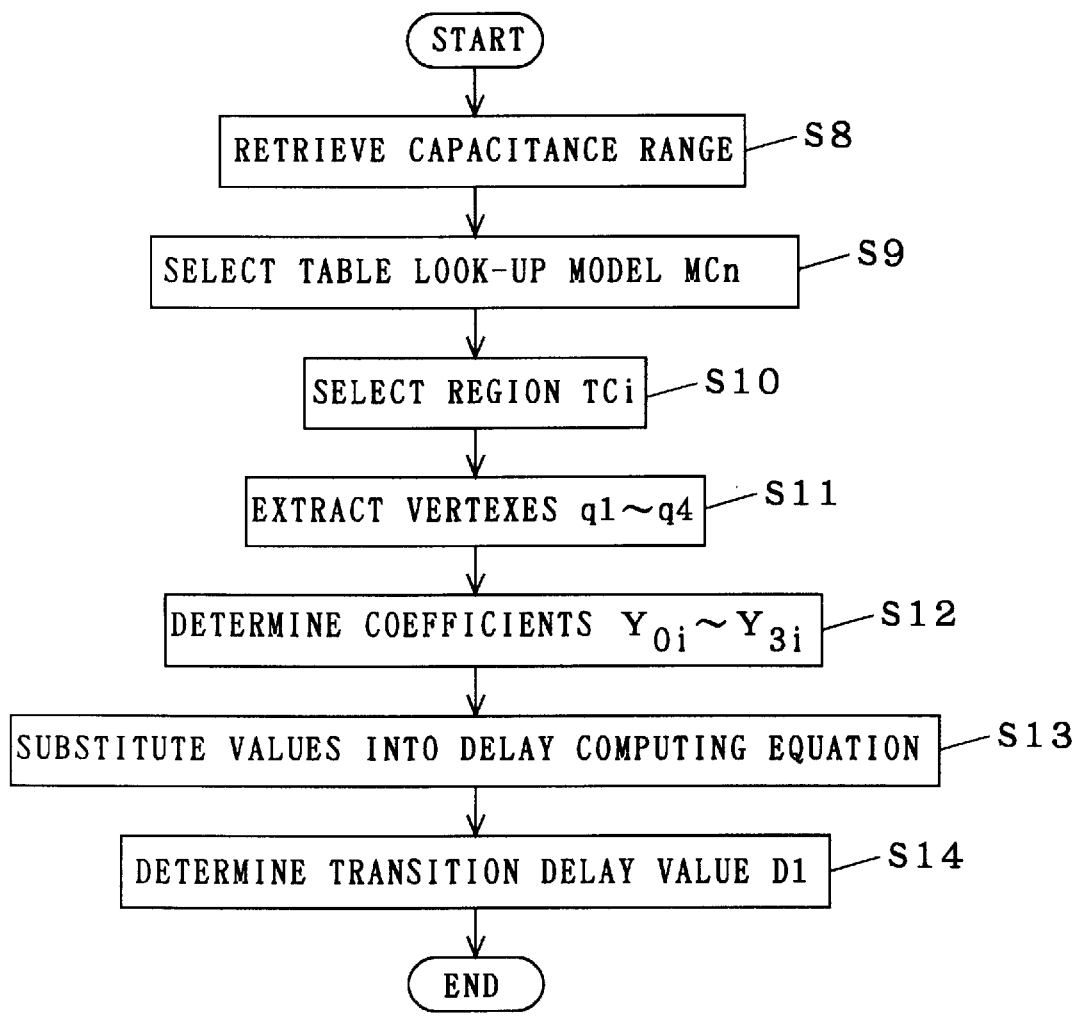
FIG. 14 is a flow chart showing a second example of the procedure of the transition delay value computing method of the first preferred embodiment.
Figure 15:
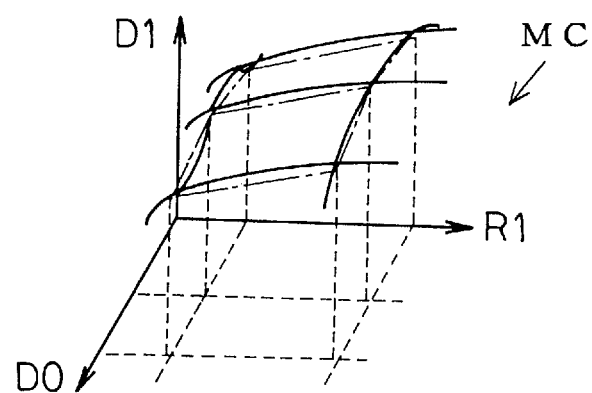
FIG. 15 is a schematic diagram showing an example of the structure of the table look-up model MC of the first preferred embodiment.

FIG. 14 to FIG. 19 correspond to FIG. 3 to FIG. 8, respectively. The second case is characterized in that the functions of the load resistance value R1 and the load capacitance value C1 in the first case are exchanged. In other respects, the structures are substantially the same. The transition delay value computing method of the second case is carried out as shown in FIG. 14. Now, it is briefly explained.

Figure 16:
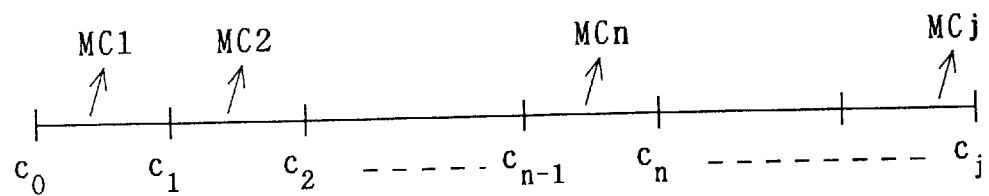
FIG. 16 is a schematic diagram showing the second example of the structure of the transition delay value computing method according to the first preferred embodiment.
Figure 17A:
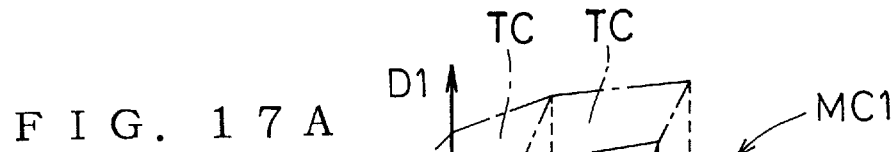
FIG. 17A to 17C are schematic diagrams showing examples of the structure of the table look-up models MC1, MC2, MCn of the first preferred embodiment.
Figure 17B:
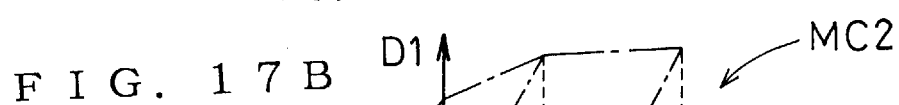
Figure 17C:
Figure 18:
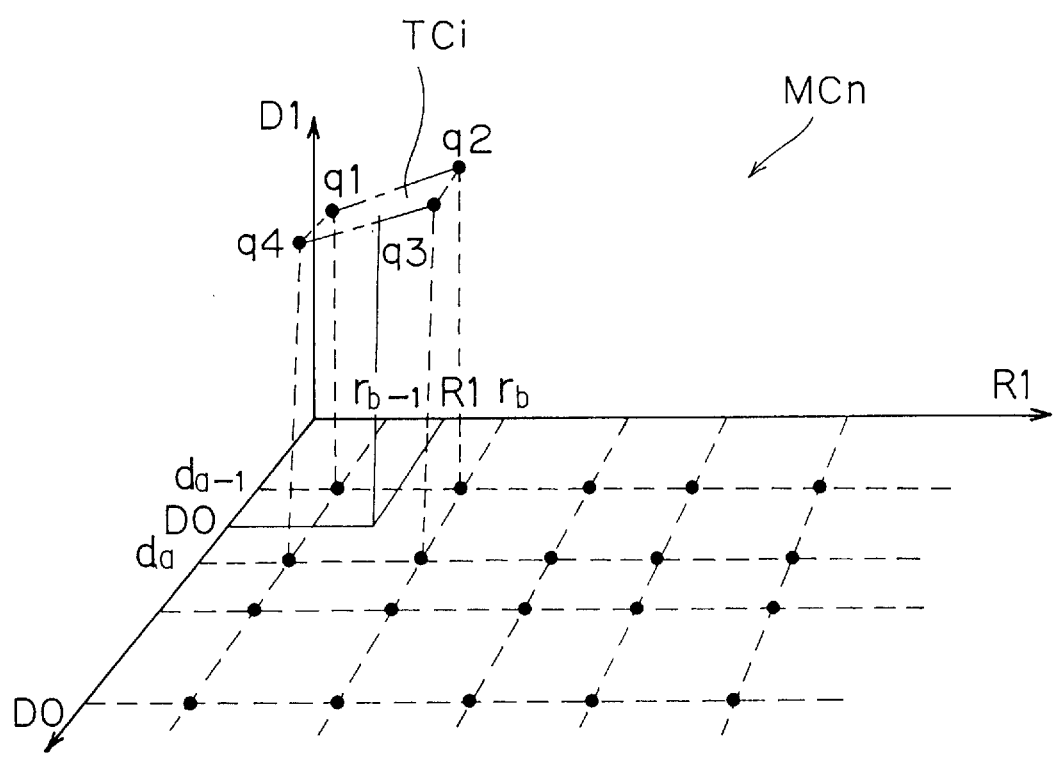
FIG. 18 is a schematic diagram showing the second example of the structure of the transition delay value computing method of the first preferred embodiment.
Figure 21:
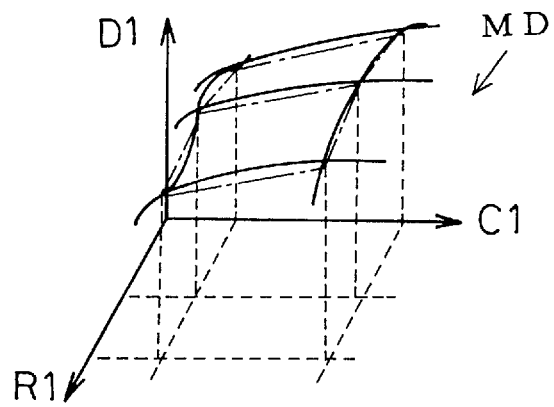
FIG. 21 is a schematic diagram showing an example of the structure of the table look-up model MD of the first preferred embodiment.

Step S8: Retrieve a capacitance range in which the load capacitance value C1 is included (FIG. 16);

Step S9: Select a table look-up model MCn corresponding to the capacitance range (FIG. 17);

Step S10: Select a region TCi on the table look-up model MCn corresponding to the transition delay value D0 and the load resistance value R1 (FIG. 18);

Step S11: Extract vertexes q1 to q4 of the region TCi (FIG. 18);

Step S12: Use the values of the coordinates of the vertexes q1 to q4 (FIG. 19) to determine the coefficients $Y_{0i}$ to $Y_{3i}$ from, $$D1_{q1}=Y_{0i}+Y_{1i}\times R1_{q1}+Y_{2i}\times D0_{q1}+Y_{3i}\times R1_{q1}\times D0_{q1} \qquad (6)$$

$$D1_{q2}=Y_{0i}+Y_{1i}\times R1_{q2}+Y_{2i}\times D0_{q2}+Y_{3i}\times R1_{q2}\times D0_{q2} \qquad (7)$$

$$D1_{q3}=Y_{0i}+Y_{1i}\times R1_{q3}+Y_{2i}\times D0_{q3}+Y_{3i}\times R1_{q3}\times D0_{q3} \qquad (8)$$

$$D1_{q4}=Y_{0i}+Y_{1i}\times R1_{q4}+Y_{2i}\times D0_{q4}+Y_{3i}\times R1_{q4}\times D0_{q4} \qquad (9)$$

Step S13: Substitute the coefficients $Y_{0i}$ to $Y_{3i}$, the transition delay value D0 and the load resistance value R1 into, $$D1=Y_{0i}+Y_{1i}\times R1+Y_{2i}\times D0+Y_{3i}\times R1\times D0 \qquad (10); \text{ and}$$

Step S14: Thereby determine the transition delay value D1. The equations (6) to (10) correspond to the equations (2) to (5) and the equation (1), respectively.

Next, the third case will be described considering the difference between the first case and the third case.

FIG. 20 to FIG. 25 are diagrams respectively corresponding to FIG. 3 to FIG. 8. The third case is characterized in that the functions of the load resistance value R1 and the transition delay value D0 in the first case are exchanged. In other respects, the structures are substantially the same. The transition delay value computing method of the third case is carried out as shown in FIG. 20. Now, it is briefly explained.

Figure 22:
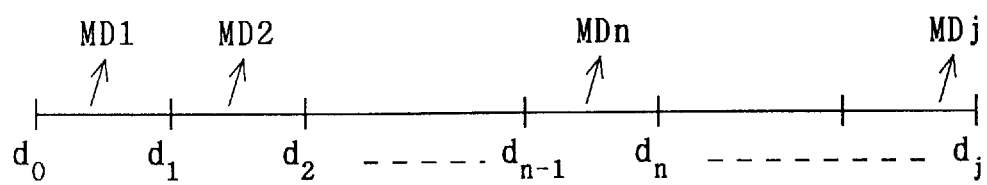
FIG. 22 is a schematic diagram showing the third example of the structure of the transition delay value computing method of the first preferred embodiment.
Figure 23A:
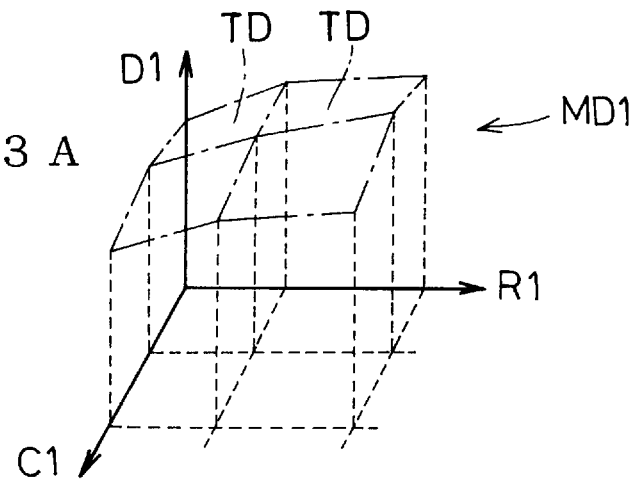
FIG. 23A to 23C are schematic diagrams showing an example of the structure of the table look-up models MD1, MD2, MDn of the first preferred embodiment.
Figure 23B:
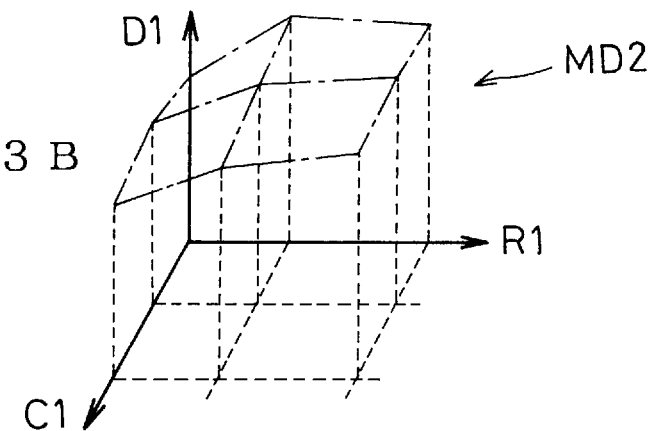
Figure 23C:
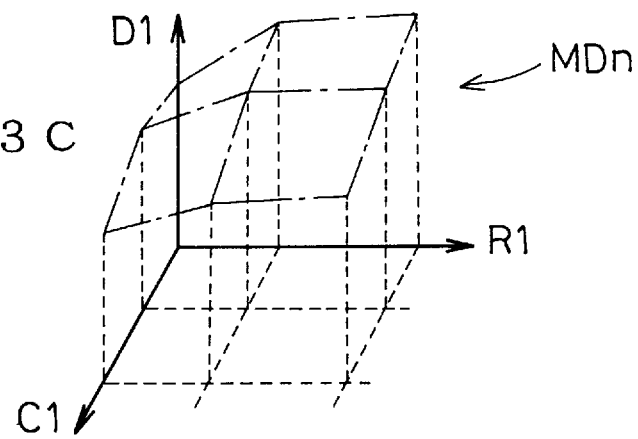
Figure 24:
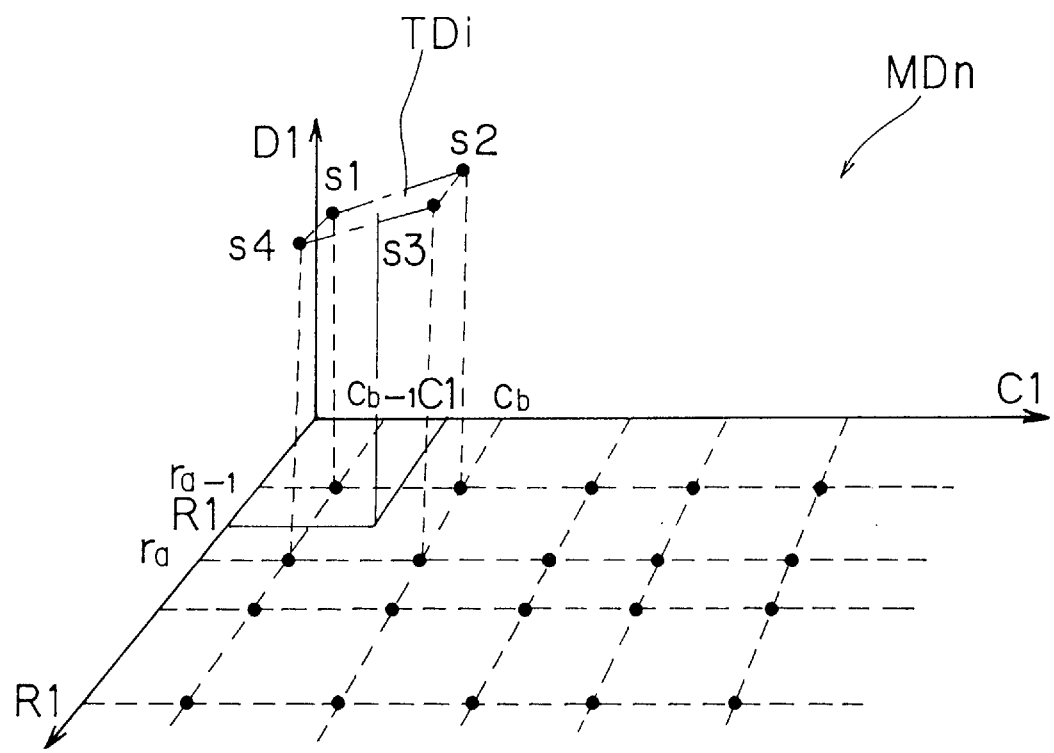
FIG. 24 is a schematic diagram showing the third example of structure of the transition delay value computing method of the first preferred embodiment.

Step S15: Retrieve a delay range in which the transition delay value D0 is included (FIG. 22);

Step S16: Select a table look-up model MDn corresponding to the delay range (FIG. 23);

Step S17: Select a region TDi on the table look-up model MDn corresponding to the load capacitance value C1 and the load resistance value R1 (FIG. 24);

Step S18: Extract the vertexes s1 to s4 of the region TDi (FIG. 24);

Step S19: Use values of the coordinates of the vertexes s1 to s4 (FIG. 25) to determine the coefficients $Z_{0i}$ to $Z_{3i}$ from, $$D1_{s1}=Z_{0i}+Z_{1i}\times R1_{s1}+Z_{2i}\times C1_{s1}+Z_{3i}\times R1_{s1}\times C1_{s1} \qquad (11)$$

$$D1_{s2}=Z_{0i}+Z_{1i}\times R1_{s2}+Z_{2i}\times C1_{s2}+Z_{3i}\times R1_{s2}\times C1_{s2} \qquad (12)$$

$$D1_{s3}=Z_{0i}+Z_{1i}\times R1_{s3}+Z_{2i}\times C1_{s3}+Z_{3i}\times R1_{s3}\times C1_{s3} \qquad (13)$$

$$D1_{s4}=Z_{0i}+Z_{1i}\times R1_{s4}+Z_{2i}\times C1_{s4}+Z_{3i}\times R1_{s4}\times C1_{s4} \qquad (14)$$

Step S20: Substitute the coefficients $Z_{0i}$ to $Z_{3i}$, the load capacitance value C1 and the load resistance value R1 into, $$D1=Z_{0i}+Z_{1i}\times R1+Z_{2i}\times C1+Z_{3i}\times R1\times C1 \qquad (15); \text{ and}$$

Step S21: Thereby determine the transition delay value D1. The equations (11) to (15) correspond to the equations (2) to (5) and the equation (1), respectively.

As is clear from the description above, in the first to third cases, one of the transition delay value D0, the load resistance value R1 and the load capacitance value C1 which is used to select the table look-up model is not directly substituted into the equation for determining the transition delay value D1 (the equation 1, the equation 10 and the equation 15).

In the table look-up model, the value used to select the table look-up model is reflected in the value of the transition delay value D1 only in range units. That is to say, the one used for selection is only discretely reflected in the transition delay value D1. The remaining two which are substituted into the equation for determining the transition delay value D1 are continuously reflected in the transition delay value D1.

Accordingly, it is preferred that one, among the transition delay value D0, the load resistance value R1 and the load capacitance value C1, which a user considers to be the least important is used to select the table look-up model.

Second Preferred Embodiment

The same components and structures as those already explained are shown with the same reference characters and not described again.

Figures 25, 26:
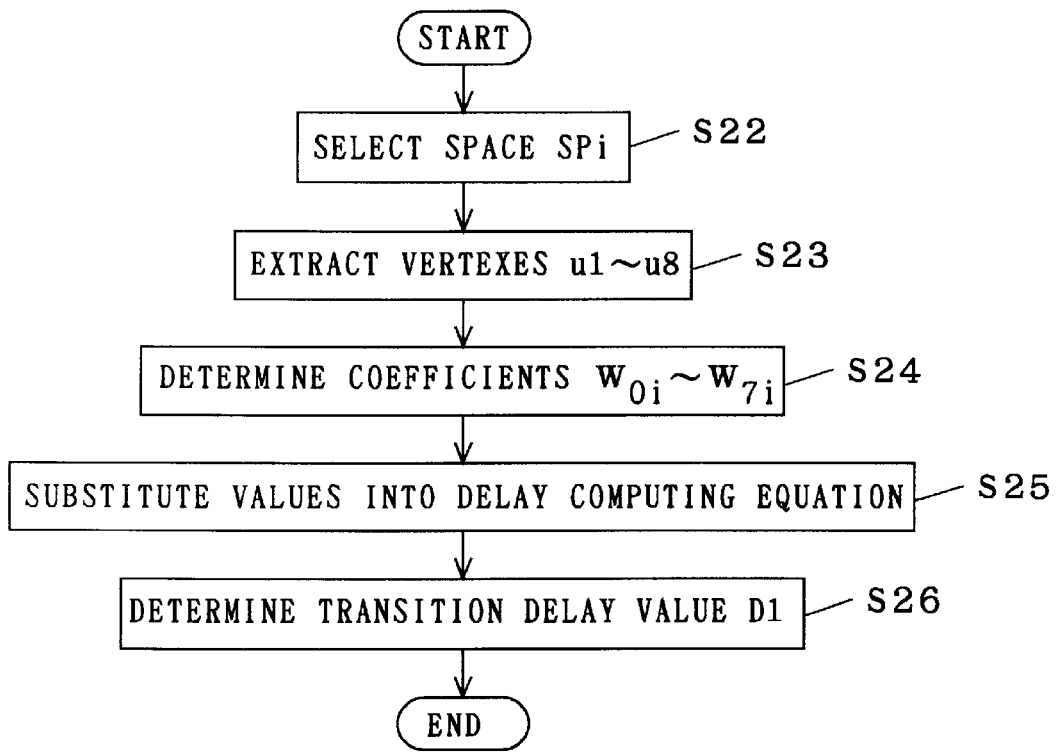
FIG. 25 is a schematic diagram illustrating coordinates of the vertexes s1 to s4 of the region TDi shown in FIG. 24.
FIG. 26 is a flow chart illustrating the procedure of a transition delay value computing method of a second preferred embodiment.

FIG. 26 is a flow chart illustrating the procedure of the transition delay value computing method according to this preferred embodiment. The transition delay value computing method of the first preferred embodiment is characterized in the following respects;

there are a plurality of table look-up models and one of them is selected on the basis of one of the transition delay value D0, the load resistance value R1 and the load capacitance value C1, and the remaining two of the transition delay value D0, the load resistance value R1 and the load capacitance value C1 are components of the table look-up model.

The transition delay value computing method of this preferred embodiment is different from that of the first preferred embodiment in the following respects;

there is a single table look-up model, and all of the transition delay value D0, the load resistance value R1 and the load capacitance value C1 are components in the table look-up model.

The procedure of the transition delay value computing method of this preferred embodiment will now be described, considering the difference between the transition delay value computing method of the first preferred embodiment and that of this preferred embodiment.

Figures 27, 28:
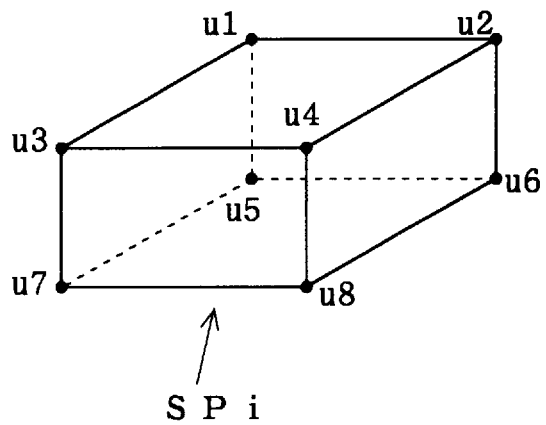
FIG. 27 is a schematic diagram illustrating the space SPi of the second preferred embodiment.
FIG. 28 is a schematic diagram illustrating coordinates of the vertexes u1 to u8 of the space SPi shown in FIG. 27.

FIG. 27 is a schematic diagram illustrating a space SPi. The space SPi is a divided region in the space of load capacitance value C1—load resistance value R1—transition delay value D0—transition delay value D1 which exists on the table look-up model. The table look-up model is a group of such spaces as shown in the figure. The space SPi is the i-th one of the spaces SP. A computing device which carries out the transition delay value computing method selects one in the group of spaces which includes the load capacitance value C1, the load resistance value R1 and the transition delay value D0 shown in FIG. 2 as the space SPi (Step S22 in FIG. 26.)

Next, the eight vertexes u1 to u8 of the space SPi shown in FIG. 27 are extracted (Step S23). The vertexes u1 to u8 stored in the file in the computing device for each space SP are called according to the selected space SPi. The vertexes u1 to u8 are thus extracted.

FIG. 28 is a schematic diagram showing coordinates of the vertexes u1 to u8. As shown in the diagram, the vertex uk is represented by the coordinates ($C1_{uk}$, $R1_{uk}$, $D0_{uk}$, $D1_{uk}$). The coordinates $C1_{uk}$, $R1_{uk}$, $D0_{uk}$ are ones of discrete "particular values" of the load capacitance value C1, the load resistance value R1 and the transition delay value D0. In this preferred embodiment, k represents an arbitrary integer among 1 to 8. The coordinates surrounded by the two-dot chain line in the diagram are necessary to determine the space SPi. The coordinates surrounded by the solid line are necessary to determine the coefficients $W_{0i}$ to $W_{7i}$ included in the delay computing equation used in this preferred embodiment, given as:

$$D1 = W_{0i} + W_{1i} \times R1 + W_{2i} \times C1 + W_{3i} \times D0 + W_{4i} \times R1 \times D0 + W_{5i} \times C1 \times D0 + W_{6i} \times C1 \times R1 + W_{7i} \times C1 \times R1 \times D0 \quad (16)$$

As shown in FIG. 28, the vertex uk has as its coordinate components the coordinates $C1_{uk}$, $R1_{uk}$, $D0_{uk}$, each being one value of the load capacitance value C1, the load resistance value R1 and the transition delay value D0, and the coordinate $D1_{uk}$, which is one value of the transition delay value D1 which is known for that combination.

Next, substituting the four coordinates of the vertex uk, $C1_{uk}$, $R1_{uk}$, $D0_{uk}$, $D1_{uk}$, into C1, R1, D0, D1 in the equation (16) is repeated in order for k=1 to 8. This provides the equations (17) to (24) given below.

$$D1_{u1} = W_{0i} + W_{1i} \times R1_{u1} + W_{2i} \times C1_{u1} + W_{3i} \times D0_{u1} + W_{4i} \times R1_{u1} \times D0_{u1} + W_{5i} \times C1_{u1} \times D0_{u1} + W_{6i} \times C1_{u1} \times R1_{u1} + W_{7i} \times C1_{u1} \times R1_{u1} \times D0_{u1} \quad (17)$$

$$D1_{u2} = W_{0i} + W_{1i} \times R1_{u2} + W_{2i} \times C1_{u2} + W_{3i} \times D0_{u2} + W_{4i} \times R1_{u2} \times D0_{u2} + W_{5i} \times C1_{u2} \times D0_{u2} + W_{6i} \times C1_{u2} \times R1_{u2} + W_{7i} \times C1_{u2} \times R1_{u2} \times D0_{u2} \quad (18)$$

$$D1_{u3} = W_{0i} + W_{1i} \times R1_{u3} + W_{2i} \times C1_{u3} + W_{3i} \times D0_{u3} + W_{4i} \times R1_{u3} \times D0_{u3} + W_{5i} \times C1_{u3} \times D0_{u3} + W_{6i} \times C1_{u3} \times R1_{u3} + W_{7i} \times C1_{u3} \times R1_{u3} \times D0_{u3} \quad (19)$$

$$D1_{u4} = W_{0i} + W_{1i} \times R1_{u4} + W_{2i} \times C1_{u4} + W_{3i} \times D0_{u4} + W_{4i} \times R1_{u4} \times D0_{u4} + W_{5i} \times C1_{u4} \times D0_{u4} + W_{6i} \times C1_{u4} \times R1_{u4} + W_{7i} \times C1_{u4} \times R1_{u4} \times D0_{u4} \quad (20)$$

$$D1_{u5} = W_{0i} + W_{1i} \times R1_{u5} + W_{2i} \times C1_{u5} + W_{3i} \times D0_{u5} + W_{4i} \times R1_{u5} \times D0_{u5} + W_{5i} \times C1_{u5} \times D0_{u5} + W_{6i} \times C1_{u5} \times R1_{u5} + W_{7i} \times C1_{u5} \times R1_{u5} \times D0_{u5} \quad (21)$$

$$D1_{u6} = W_{0i} + W_{1i} \times R1_{u6} + W_{2i} \times C1_{u6} + W_{3i} \times D0_{u6} + W_{4i} \times R1_{u6} \times D0_{u6} + W_{5i} \times C1_{u6} \times D0_{u6} + W_{6i} \times C1_{u6} \times R1_{u6} + W_{7i} \times C1_{u6} \times R1_{u6} \times D0_{u6} \quad (22)$$

$$D1_{u7} = W_{0i} + W_{1i} \times R1_{u7} + W_{2i} \times C1_{u7} + W_{3i} \times D0_{u7} + W_{4i} \times R1_{u7} \times D0_{u7} + W_{5i} \times C1_{u7} \times D0_{u7} + W_{6i} \times C1_{u7} \times R1_{u7} + W_{7i} \times C1_{u7} \times R1_{u7} \times D0_{u7} \quad (23)$$

$$D1_{u8} = W_{0i} + W_{1i} \times R1_{u8} + W_{2i} \times C1_{u8} + W_{3i} \times D0_{u8} + W_{4i} \times R1_{u8} \times D0_{u8} + W_{5i} \times C1_{u8} \times D0_{u8} + W_{6i} \times C1_{u8} \times R1_{u8} + W_{7i} \times C1_{u8} \times R1_{u8} \times D0_{u8} \quad (24)$$

From the eight simultaneous equations, the values of the coefficients $W_{0i}$ to $W_{7i}$ of the delay computing equation are determined (Step S24). The coefficients $W_{0i}$ to $W_{7i}$ determined, the load capacitance value C1, the load resistance value R1 and the transition delay value D0 are substituted into the equation (16) (Step S25) to determine the objective transition delay value D1 (Step S26).

In this preferred embodiment, the coefficients $W_{0i}$ to $W_{7i}$, the load capacitance value C1, the load resistance value R1 and the transition delay value D0 are substituted into the equation (16), a delay computing equation. In the first case of the first preferred embodiment, for example, only the coefficients $X_{0i}$ to $X_{3i}$, the load capacitance value C1, and the transition delay value D0 are substituted into the equation (1) and the load resistance value R1 is not substituted therein. In other words, the load resistance value R1 is only discretely reflected in the transition delay value D1 in the units of resistance ranges and its value is not continuously reflected in the transition delay value D1 in the first case of the first preferred embodiment. In this preferred embodiment, however, the value of the load resistance value R1 is substituted into the equation for determining the value of the transition delay value D1 so that it is continuously reflected. The same logic applies to the load capacitance value C1 in the second case and the transition delay value D1 in the third case.

Accordingly, in the transition delay value computing method of this preferred embodiment, in addition to the effects of the first preferred embodiment, the load capacitance value C1, the load resistance value R1 and the transition delay value D0 are continuously reflected in the transition delay value D1, so that the transition delay value D1 can be determined more accurately than in the first preferred embodiment.

Next, the method of producing the table look-up model of this preferred embodiment will be described. The circuit model shown in FIG. 11 and the signal shown in FIG. 12 used in the first preferred embodiment are used also in this preferred embodiment.

Circuit simulation is performed with respect to such vertexes of a space SP of the table look-up model as represented by the eight vertexes u1 to u8 of the space SPi shown in FIG. 27. It is now fully described. A circuit model and a signal are prepared which are characterized by the components of the coordinates about the load capacitance value C1, the load resistance value R1 and the transition delay value D0 (surrounded by the two-dot chain line in FIG. 28) in the coordinates of certain one of the vertexes u1 to u8. Using this circuit model and signal, the circuit simulation is carried out similarly to the first preferred embodiment. This circuit simulation provides a value about the transition delay value D1, the fourth component of the vertex. Thus all components of that vertex have become known.

A table look-up model is produced by performing this circuit simulation for all vertexes of the table look-up model.

Third Preferred Embodiment

In this preferred embodiment, it is shown that the computing speed is further improved by improving the transition delay value computing methods according to the first and second preferred embodiments.

Figure 29:
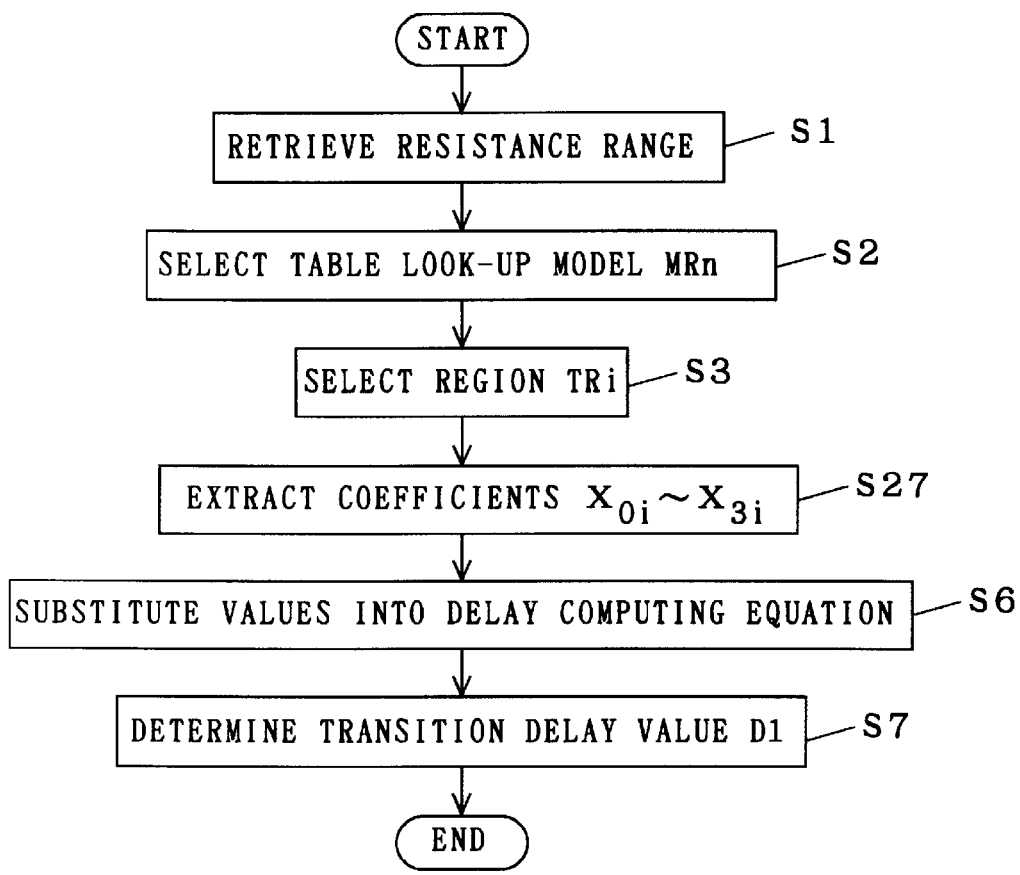
FIG. 29 is a flow chart showing a first example of the procedure of a transition delay value computing method of a third preferred embodiment.

FIG. 29 is a flow chart illustrating the procedure of the transition delay value computing method according to this preferred embodiment. This diagram shows an example of improvement of the transition delay value computing method of the first case of the first preferred embodiment. The transition delay value computing method of the first case of the first preferred embodiment shown in FIG. 3 and the transition delay value computing method of this preferred embodiment shown in FIG. 29 differ in the following respects. That is, the difference lies between the Step S3 for selecting the region TRi and the Step S6 for substituting values into the delay computing equations:

the step for selecting the vertexes p1 to p4 (Step S4) and the step for determining the coefficients $X_{0i}$ to $X_{3i}$ (Step S5) shown in FIG. 3 are removed; and the step for extracting the coefficients $X_{0i}$ to $X_{3i}$ (Step S27) is added in FIG. 29.

The structures are the same in other respects.

In the first case of the first preferred embodiment, the computation is carried out using the equations (2) to (5) in Step S5 for determining the coefficients $X_{0i}$ to $X_{3i}$. It is understood, however, that the vertexes p1 to p4 of a certain region TRi selected are unique and that the coefficients $X_{0i}$ to $X_{3i}$ unique to the vertexes p1 to p4 are obtained. That is to say, the coefficients $X_{0i}$ to $X_{3i}$ are unique to the region TRi in one-to-one correspondence. Accordingly, the coefficients $X_{0i}$ to $X_{3i}$ unique to the region TRi are previously obtained with respect to all regions TR and stored in a file. After the region TRi is selected in Step S3, corresponding coefficients $X_{0i}$ to $X_{3i}$ are called from the file, or extracted quickly, to eliminate the necessity of computing the coefficients $X_{0i}$ to $X_{3i}$ using the equations (2) to (5). This considerably reduces the time required in the transition delay value computing method.

Figure 30:
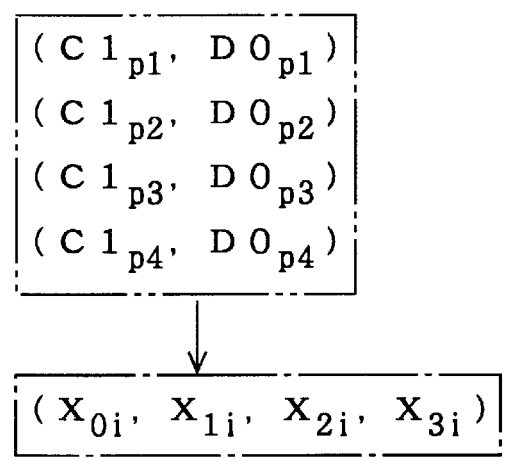
FIG. 30 is a schematic diagram illustrating values required in the first example shown in FIG. 29.

FIG. 30 is a schematic diagram illustrating coordinates used in the transition delay value computing method of this preferred embodiment. In this preferred embodiment, in the coordinates of the vertexes p1 to p4 shown in FIG. 8, values about the load capacitance value C1 and the transition delay value D0 (surrounded by the two-dot chain line) are necessary, which are stored in the file. This is because the coordinates about the load capacitance value C1 and the transition delay value D0 are required to select the region TRi. Then the coefficients $X_{0i}$ to $X_{3i}$ surrounded by the one-dot chain line are extracted quickly from these values of the coordinates. In order to realize this structure, the coefficients $X_{0i}$ to $X_{3i}$ are stored in the file of the computing device instead of the vertexes p1 to p4 extracted in the first case of the first preferred embodiment. This structure realizes the transition delay value computing method of this preferred embodiment.

Figure 31:
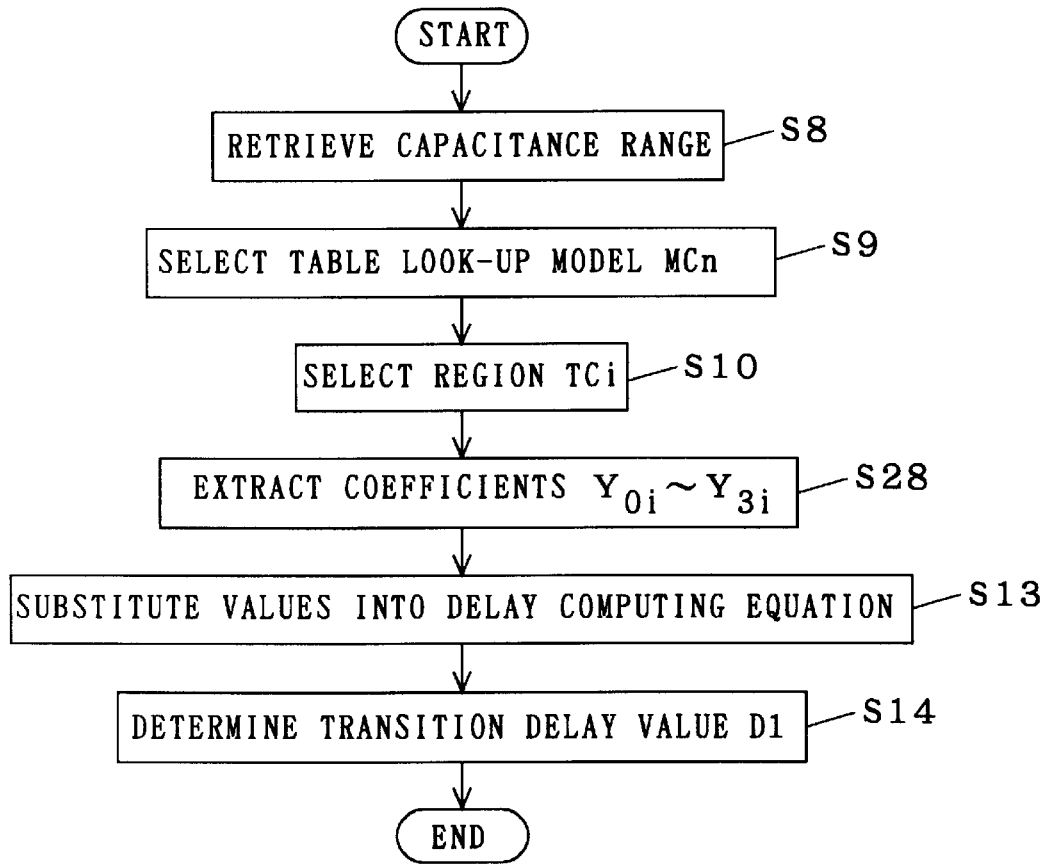
FIG. 31 is a flow chart showing a second example of the procedure of the transition delay value computing method of the third preferred embodiment.
Figure 32:
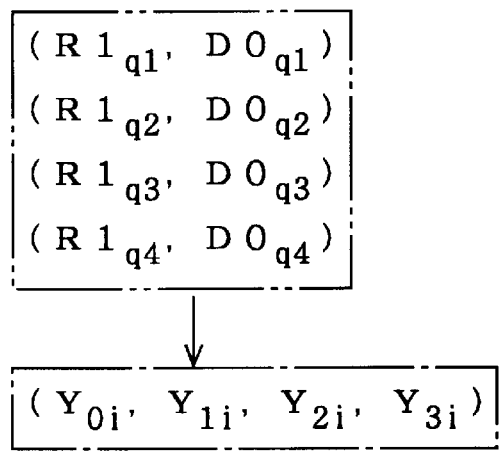
FIG. 32 is a schematic diagram illustrating values required in the second example shown in FIG. 31.
Figure 33:
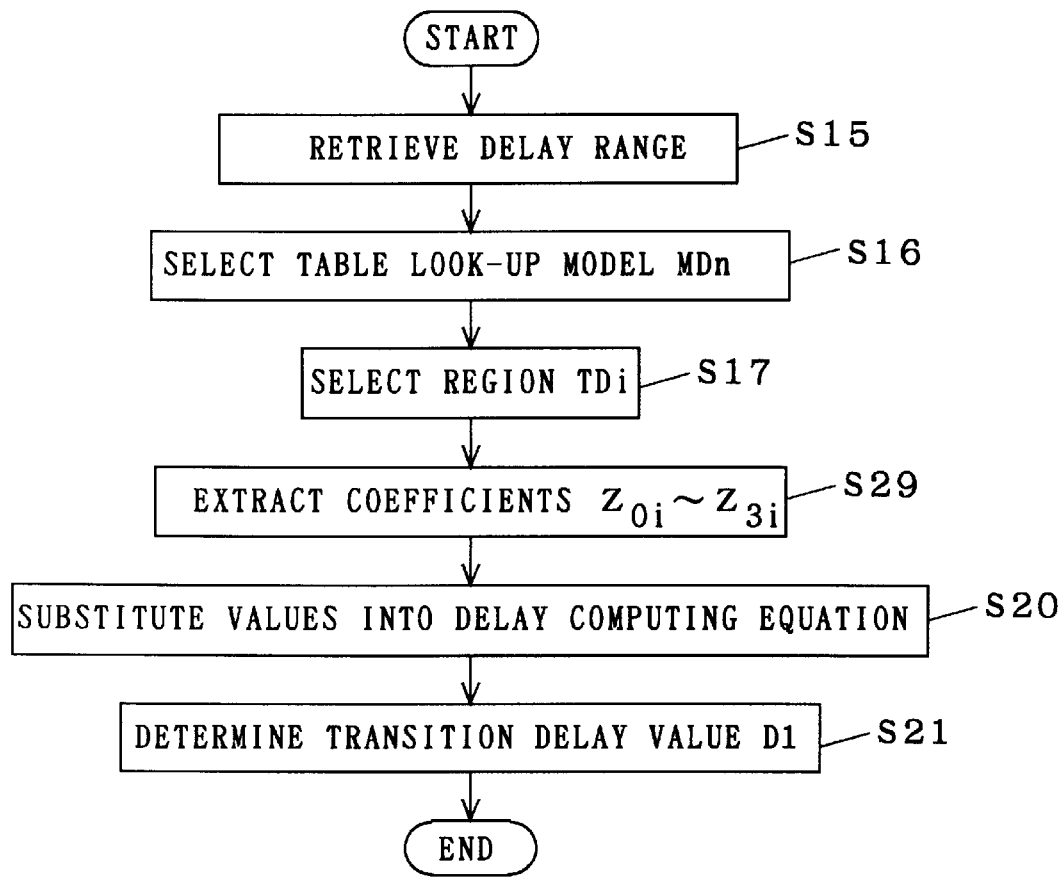
FIG. 33 is a flow chart showing a third example of the procedure of the transition delay value computing method of the third preferred embodiment.
Figure 34:
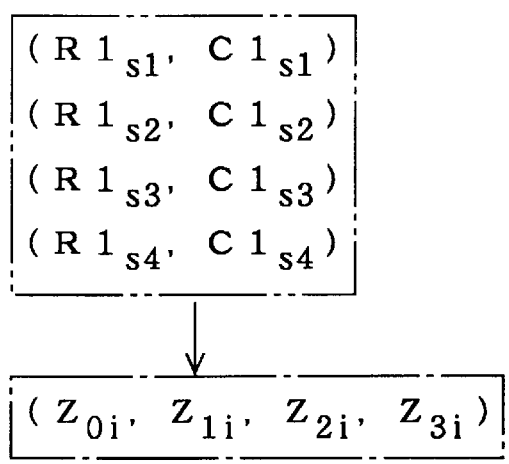
FIG. 34 is a schematic diagram illustrating values required in the third example shown in FIG. 33.
Figure 35:
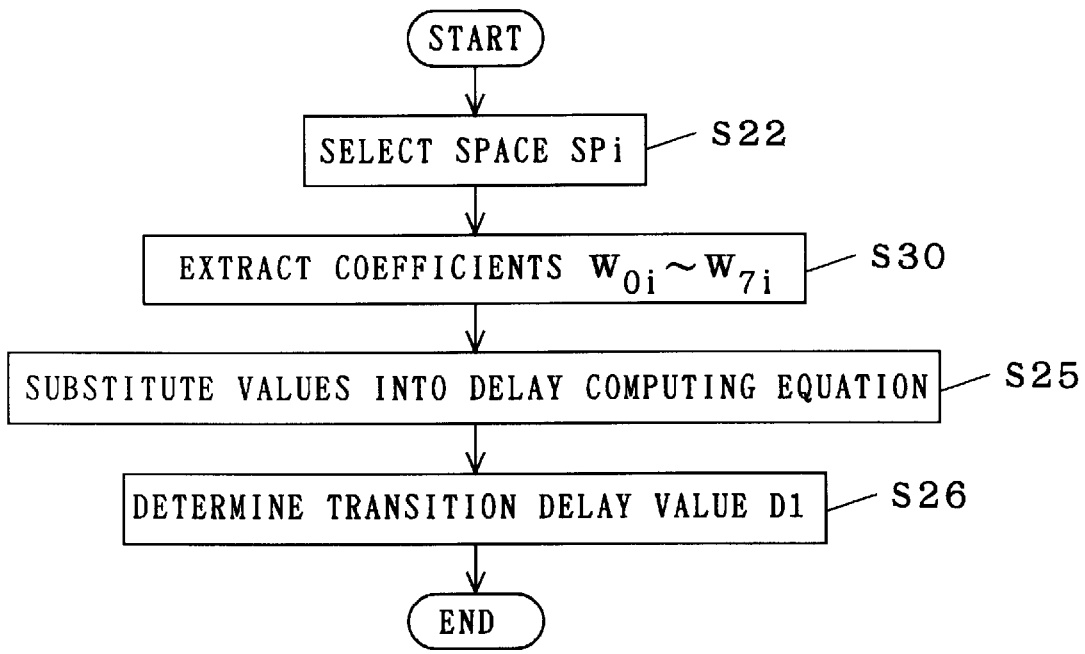
FIG. 35 is a flow chart showing a fourth example of the procedure of the transition delay value computing method of the third preferred embodiment.
Figure 36:
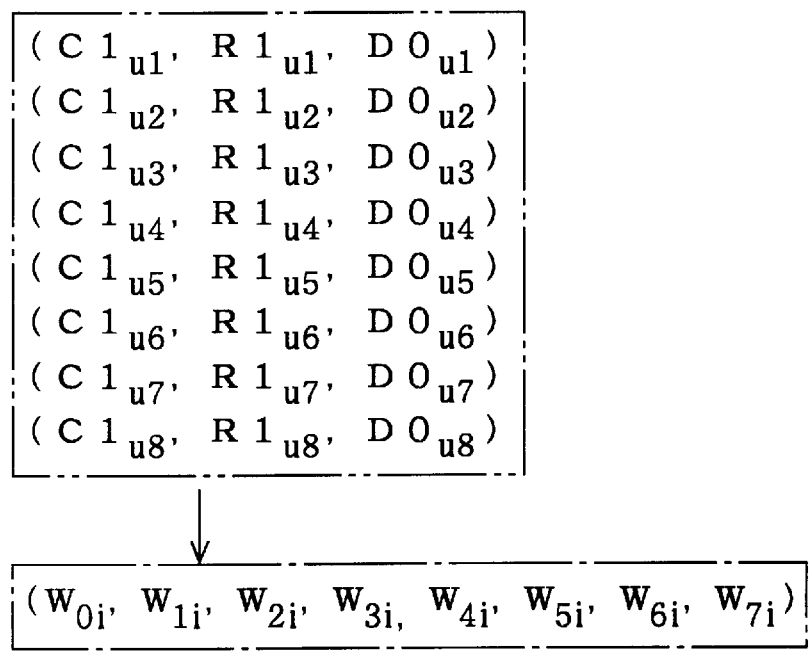
FIG. 36 is a schematic diagram illustrating values required in the fourth example shown in FIG. 35.
Figure 37:
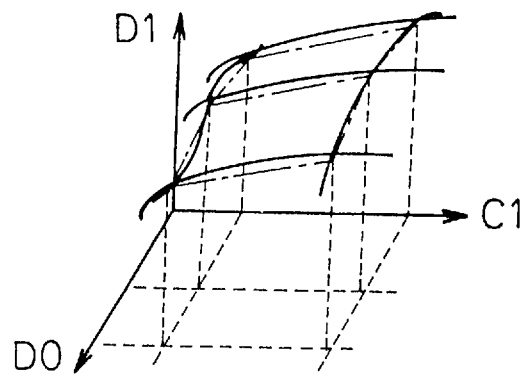
FIG. 37 is a schematic diagram showing a conventional table look-up model.
Figure 38:
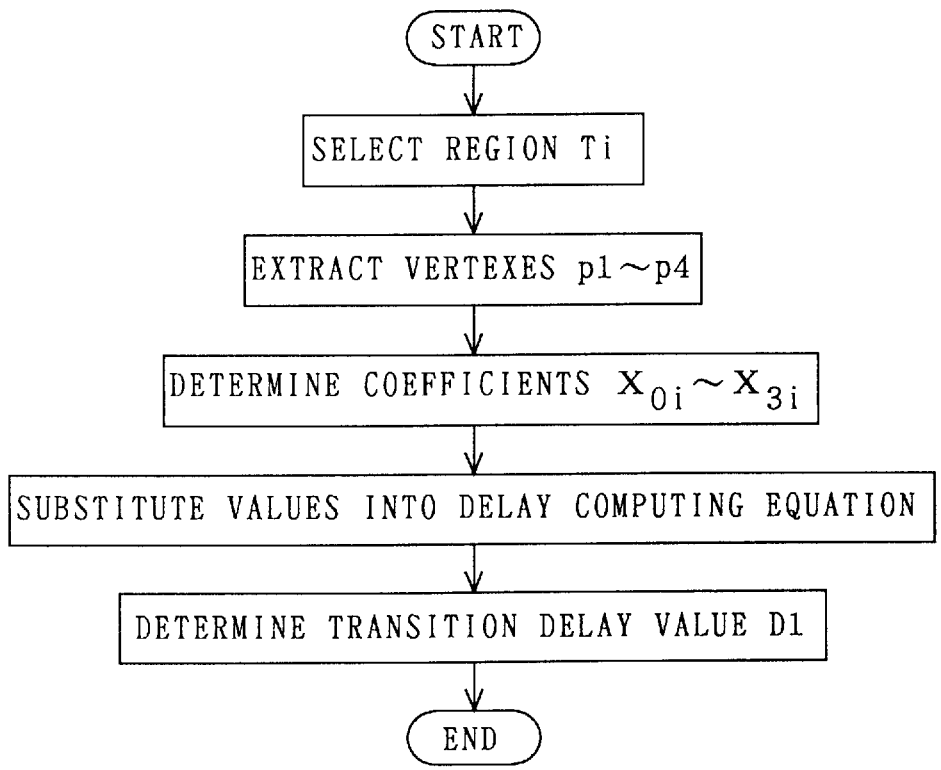
FIG. 38 is a schematic diagram showing the procedure of the conventional signal delay computing method.
Figures 39, 40:
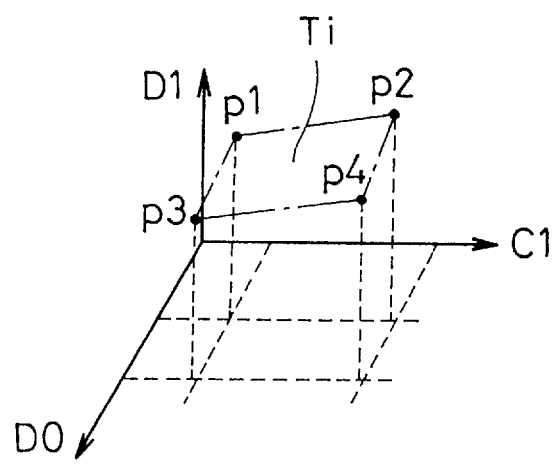
FIG. 39 is a schematic diagram showing a region in the conventional signal delay computing method.
FIG. 40 is a schematic diagram showing coordinates of the vertexes of the region shown in FIG. 39.

It is a matter of course that the aforementioned structure can also be applied to the second and third cases of the first preferred embodiment and the second preferred embodiment. FIG. 31 and FIG. 32 relate to the second case of the first preferred embodiment, FIG. 33 and FIG. 34 relate to the third case of the first preferred embodiment and FIG. 35 and FIG. 36 relate to the second preferred embodiment, which respectively correspond to FIG. 29 and FIG. 30 of the first case of the first preferred embodiment. The coefficients $Y_{0i}$ to $Y_{3i}$ are stored in the file in the second case of the first preferred embodiment, the coefficients $Z_{0i}$ to $Z_{3i}$ in the third case, and the coefficients $W_{0i}$ to $W_{7i}$ in the second preferred embodiment.

In the second case of the first preferred embodiment, Step S11 and Step S12 shown in FIG. 14 are eliminated and Step S28 is newly added. According to the region TCi selected in Step S10, the coefficients $Y_{0i}$ to $Y_{3i}$ are extracted in Step S28.

In the third case of the first preferred embodiment, Step S18 and Step S19 shown in FIG. 20 are eliminated and Step S29 is newly added. According to the region TDi selected in Step S17, the coefficients $Z_{0i}$ to $Z_{3i}$ are extracted in Step S29.

In the second preferred embodiment, Step S23 and Step S24 shown in FIG. 26 are eliminated and Step S30 is newly added. According to the space SPi selected in Step S22, the coefficients $W_{0i}$ to $W_{7i}$ are extracted in Step S30.

While the invention has been described in detail, the foregoing description is in all aspects illustrative and not restrictive. It is understood that numerous other modifications and variations can be devised without departing from the scope of the invention.

I claim:

1. A signal delay computing method, comprising the steps of:

preparing a relation obtained between:

a first group which is a set of discrete particular values of a signal delay value in a first line, and second and third groups which are, respectively, sets of discrete particular values of a load resistance value and a load capacitance value in a second line connected to an output side of a circuit element having its input side connected to said first line; and a signal delay value in said second line, and determining said signal delay value in said second line corresponding to said signal delay value in said first line, said load resistance value and said load capacitance value on the basis of said relation, wherein in said determination, at least two of said signal delay value in said first line, said load resistance value and said load capacitance value are selected as parameters for interpolation, among said discrete particular values included in ones of said first through third groups which correspond to said parameters, two which are the closest to each said parameter are selected as extracted values for each said parameter, and said interpolation is performed using said extracted values.

2. The signal delay computing method according to claim 1, wherein coefficients corresponding to said parameters in an approximation equation obtained in said interpolation are prepared for a combination of said discrete particular values of said first through third groups, and an approximation value of said signal delay value in said second line is obtained according to said signal delay value in said first line, and said load resistance value and said load capacitance value.

3. The signal delay computing method according to claim 1, wherein said signal delay value in said first line, said load resistance value and said load capacitance value are selected as said parameters.

4. The signal delay computing method according to claim 3, wherein coefficients corresponding to said parameters in an approximation equation obtained in said interpolation are prepared for a combination of said discrete particular values in said first through third groups, and an approximation value of said signal delay values in said second line is obtained according to said signal delay value in said first line, and said load resistance value and said load capacitance value.

5. A signal delay computing method, comprising the steps of:

accessing a relation obtained between:

a first set of signal delay values in a first line, second and third sets, respectively, of load resistance values and load capacitance values in a second line connected to an output side of a circuit element having its input side connected to said first line, and a fourth set of signal delay values in said second line, and interpolating to compute a specific value of a signal delay in said second line on the basis of said relation.

6. The signal delay computing method according to claim 5, wherein said step of accessing comprises the steps of:
retrieving a resistance range which includes a load resistance value on the second line from among a plurality of resistance ranges;
selecting a look-up table MRn for said resistance range, said look-up table relating said signal delay values in said first line, load capacitance values in said second line, and signal delay values in said second line, and wherein said step of interpolating comprises the steps of:
selecting a region TRi from said look-up table corresponding to one of a plurality of divided regions on a plane representing a delay computing equation for the signal delay values in said second line,
determining a plurality of interpolation coefficients on the basis of said selected region TRi, and
using said coefficients to compute said specific value of said signal delay in said second line.

7. The signal delay computing method according to claim 6, wherein said step of determining a plurality of interpolation coefficients includes the step of extracting a plurality of vertex values from said selected region TRi, and determining said plurality of coefficients on the basis of said extracted vertex values.

8. The signal delay computing method according to claim 5, wherein said step of accessing comprises the steps of:
retrieving a capacitance range which includes a capacitance value on the second line from among a plurality of capacitance ranges;
selecting a look-up table MCn for said capacitance range, said look-up table relating said signal delay values in said first line, load resistance values in said second line, and signal delay values in said second line, and wherein said step of interpolating comprises the steps of:
selecting a region TCi from said look-up table corresponding to one of a plurality of divided regions on a plane representing a delay computing equation for the signal delay values in said second line,
determining a plurality of interpolation coefficients on the basis of said selected region TCi, and
using said coefficients to compute said specific value of said signal delay in said second line.

9. The signal delay computing method according to claim 8, wherein said step of determining a plurality of interpolation coefficients includes the step of extracting a plurality of vertex values from said selected region TCi, and determining said plurality of coefficients on the basis of said extracted vertex values.

10. The signal delay computing method according to claim 5, wherein said step of accessing comprises the steps of:
retrieving a delay range which includes a signal delay value on the first line from among a plurality of signal delay ranges;
selecting a look-up table MDn for said delay range, said look-up table relating said signal delay values in said second line, load resistance values in said second line, and capacitance values in said second line, and wherein said step of interpolating comprises the steps of:
selecting a region TDi from said look-up table corresponding to one of a plurality of divided regions on a plane representing a delay computing equation for the signal delay values in said second line,
determining a plurality of interpolation coefficients on the basis of said selected region TDi, and
using said coefficients to compute said specific value of said signal delay in said second line.

11. The signal delay computing method according to claim 10, wherein said step of determining a plurality of interpolation coefficients includes the step of extracting a plurality of vertex values from said selected region TDi, and determining said plurality of coefficients on the basis of said extracted vertex values.

12. The signal delay computing method according to claim 5, wherein said step of accessing comprises the step of:
selecting a space SPi which relates said signal delay values in said first line, load resistance values in said second line, capacitance values in said second line, and signal delay values in said second line, and wherein said step of interpolating comprises the steps of:
determining a plurality of interpolation coefficients on the basis of said selected space SPi, and
using said coefficients to compute said specific value of said signal delay in said second line.

13. The signal delay computing method according to claim 12, wherein said step of determining a plurality of interpolation coefficients includes the step of extracting a plurality of vertex values from said selected space SPi, and determining said plurality of coefficients on the basis of said extracted vertex values.

14. A signal delay computing apparatus, comprising:
means for accessing a relation obtained between:
a first set of signal delay values in a first line,
second and third sets, respectively, of load resistance values and load capacitance values in a second line connected to an output side of a circuit element having its input side connected to said first line, and
a fourth set of signal delay values in said second line, and
means for interpolating to compute a specific value of a signal delay in said second line on the basis of said relation.

15. The signal delay computing apparatus according to claim 14, wherein said means for accessing comprises:
means for retrieving a resistance range which includes a load resistance value on the second line from among a plurality of resistance ranges;
means selecting a look-up table MRn for said resistance range, said look-up table relating said signal delay values in said first line, load capacitances values in said second line, and signal delay values in said second line, and wherein said means for interpolating comprises:
means for selecting a region TRi from said look-up table corresponding to one of a plurality of divided regions on a plane representing a delay computing equation for the signal delay values in said second line,
means for determining a plurality of interpolation coefficients on the basis of said selected region TRi, and means for using said coefficients to compute said specific value of said signal delay in said second line.

16. The signal delay computing apparatus according to claim 15, wherein said means for determining a plurality of interpolation coefficients includes means for extracting a plurality of vertex values from said selected region TRi, and determining said plurality of coefficients on the basis of said extracted vertex values.

17. The signal delay computing apparatus according to claim 14, wherein said means for accessing comprises:
means for retrieving a capacitance range which includes a capacitance value on the second line from among a plurality of capacitance ranges;
means for selecting a look-up table MCn for said capacitance range, said look-up table relating said signal delay values in said first line, load resistance values in said second line, and signal delay values in said second line, and wherein said means for interpolating comprises:
means for selecting a region TCi from said look-up table corresponding to one of a plurality of divided regions on a plane representing a delay computing equation for the signal delay values in said second line,
means for determining a plurality of interpolation coefficients on the basis of said selected region TCi, and
means for using said coefficients to compute said specific value of said signal delay in said second line.

18. The signal delay computing apparatus according to claim 17, wherein said means for determining a plurality of interpolation coefficients includes means for extracting a plurality of vertex values from said selected region TCi, and determining said plurality of coefficients on the basis of said extracted vertex values.

19. The signal delay computing apparatus according to claim 14, wherein said means for accessing comprises:
means for retrieving a delay range which includes a signal delay value on the first line from among a plurality of signal delay ranges;
means for selecting a look-up table MDn for said delay range, said look-up table relating said signal delay values in said second line, load resistance values in said second line, and capacitance values in said second line, and wherein said means for interpolating comprises:
means for selecting a region TDi from said look-up table corresponding to one of a plurality of divided regions on a plane representing a delay computing equation for the signal delay values in said second line,
means for determining a plurality of interpolation coefficients on the basis of said selected region TDi, and
means for using said coefficients to compute said specific value of said signal delay in said second line.

20. The signal delay computing apparatus according to claim 19, wherein said means for determining a plurality of interpolation coefficients includes means for extracting a plurality of vertex values from said selected region TDi, and determining said plurality of coefficients on the basis of said extracted vertex values.

21. The signal delay computing apparatus according to claim 14, wherein said means for accessing comprises:
means for selecting a space SPi which relates said signal delay values in said first line, load resistance values in said second line, capacitance values in said second line, and signal delay values in said second line, and wherein said means for interpolating comprises:
means for determining a plurality of interpolation coefficients on the basis of said selected space SPi, and
means for using said coefficients to compute said specific value of said signal delay in said second line.

22. The signal delay computing apparatus according to claim 21, wherein said means for determining a plurality of interpolation coefficients includes means for extracting a plurality of vertex values from said selected space SPi, and determining said plurality of coefficients on the basis of said extracted vertex values.

* * * * *